(12) United States Patent
Ogawa

(10) Patent No.: US 11,088,191 B2
(45) Date of Patent: Aug. 10, 2021

(54) PHOTOELECTRIC CONVERSION DEVICE HAVING ISOLATION PORTIONS, AND IMAGING SYSTEM AND MOVING BODY HAVING PHOTOELECTRIC CONVERSION DEVICE

(71) Applicant: CANON KABUSHIKI KAISHA, Tokyo (JP)

(72) Inventor: Toshiyuki Ogawa, Abiko (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 34 days.

(21) Appl. No.: 16/267,119

(22) Filed: Feb. 4, 2019

(65) Prior Publication Data

US 2019/0252425 A1 Aug. 15, 2019

(30) Foreign Application Priority Data

Feb. 9, 2018 (JP) .................................. 2018-022397

(51) Int. Cl.
*H01L 27/146* (2006.01)
*H01L 31/112* (2006.01)

(52) U.S. Cl.
CPC ...... *H01L 27/1463* (2013.01); *H01L 27/1464* (2013.01); *H01L 27/14603* (2013.01); *H01L 27/14612* (2013.01); *H01L 27/14636* (2013.01); *H01L 27/14643* (2013.01); *H01L 27/14689* (2013.01); *H01L 31/112* (2013.01)

(58) Field of Classification Search
CPC ............. H01L 27/1463; H01L 27/1464; H01L 27/14603; H01L 27/14643; H01L 27/14612; H01L 27/14689; H01L 27/14636; H01L 31/112
See application file for complete search history.

(56) References Cited

U.S. PATENT DOCUMENTS

| | | | | |
|---|---|---|---|---|
| 9,231,019 B2* | 1/2016 | Shimotsusa | ............ | H04N 5/378 |
| 9,947,707 B2* | 4/2018 | Lee | ................... | H01L 27/14627 |
| 9,954,022 B2* | 4/2018 | Chen | ................. | H01L 27/14643 |
| 10,622,394 B2* | 4/2020 | Wu | .................... | H01L 27/14687 |
| 2009/0016636 A1* | 1/2009 | Kasashima | ............ | H04N 5/272 382/274 |
| 2013/0285181 A1* | 10/2013 | Lin | ..................... | H01L 27/1463 257/432 |

(Continued)

FOREIGN PATENT DOCUMENTS

| | | |
|---|---|---|
| JP | 2010-536187 A | 11/2010 |
| JP | 2014-204047 A | 10/2014 |

(Continued)

*Primary Examiner* — Stephen W Smoot
*Assistant Examiner* — Vicki B. Booker
(74) *Attorney, Agent, or Firm* — Canon U.S.A., Inc. IP Division

(57) ABSTRACT

A photoelectric conversion device has an isolation structure. First and second isolation portions are provided between first and second photoelectric conversion elements. The first isolation portion extends from a first plane of a semiconductor layer to a position corresponding to at least a quarter of a length from the first plane to a second plane of the semiconductor layer. The second isolation portion extends from the second plane of the semiconductor layer to a position corresponding to at least a quarter of the length from the first plane to the second plane.

19 Claims, 12 Drawing Sheets

(56) References Cited

U.S. PATENT DOCUMENTS

| | | | |
|---|---|---|---|
| 2015/0221702 A1* | 8/2015 | Jung | H01L 27/14665 257/40 |
| 2015/0349001 A1* | 12/2015 | Wang | H01L 27/1463 257/443 |
| 2015/0372031 A1 | 12/2015 | Yoon, et al. | |
| 2016/0064430 A1* | 3/2016 | Lee | H01L 27/14627 348/302 |

FOREIGN PATENT DOCUMENTS

| | | |
|---|---|---|
| JP | 2015-155839 A | 8/2015 |
| JP | 2017-55127 A | 3/2017 |
| JP | 2017-199875 A | 11/2017 |

* cited by examiner

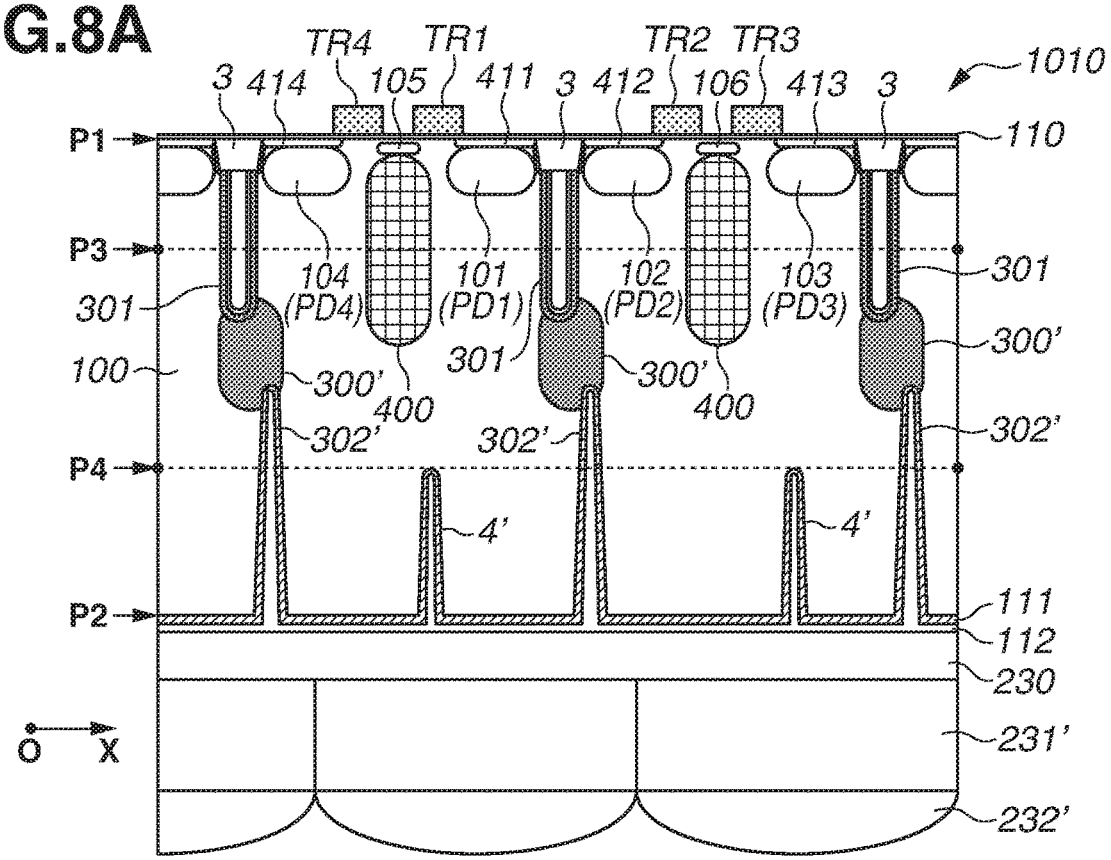
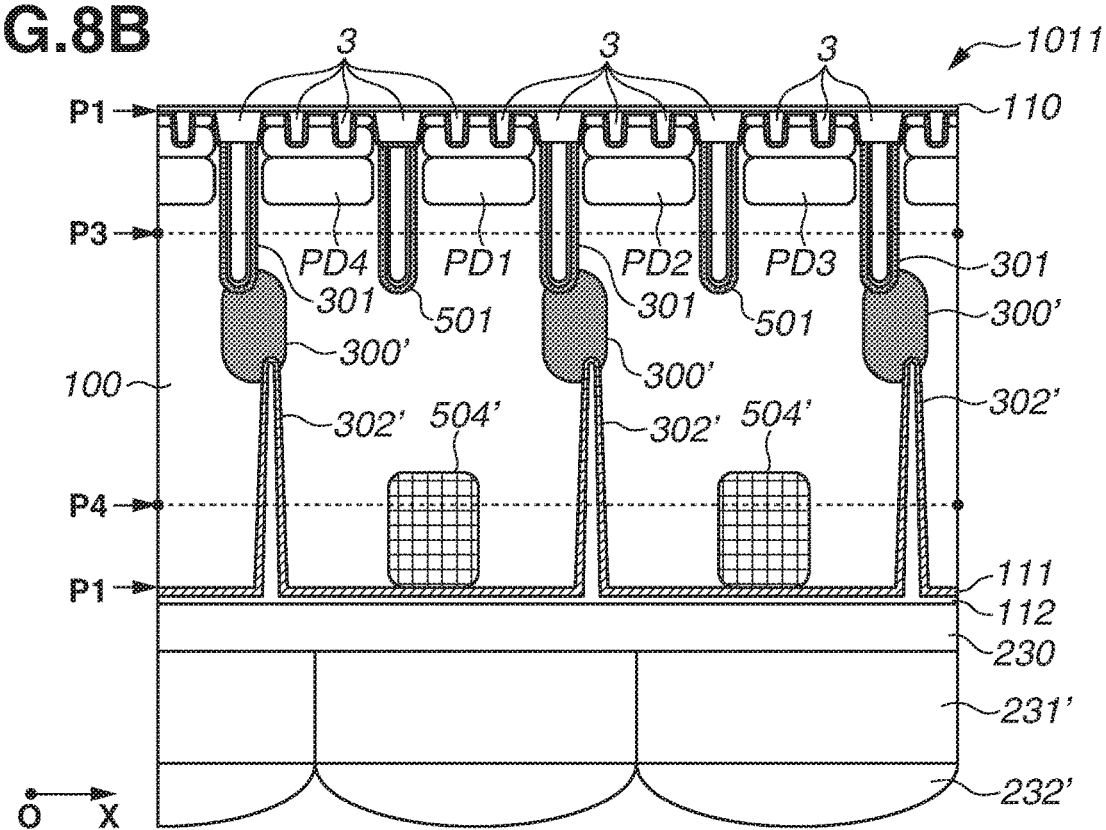

(EXAMPLE OF IN-VEHICLE CAMERA)

PHOTOELECTRIC CONVERSION DEVICE HAVING ISOLATION PORTIONS, AND IMAGING SYSTEM AND MOVING BODY HAVING PHOTOELECTRIC CONVERSION DEVICE

BACKGROUND OF THE INVENTION

Field of the Invention

One disclosed aspect of the embodiments relates to a photoelectric conversion device, an imaging system, and a moving body.

Description of the Related Art

In a photoelectric conversion device, various isolation structures between elements have been discussed. Japanese Patent Application Laid-Open No. 2014-204047 discusses an isolation structure including a groove penetrating through a semiconductor substrate from a first plane of the semiconductor substrate.

Japanese Patent Application Laid-Open No. 2017-199875 discusses the provision of different isolation structures based on the places.

With the miniaturization of a pixel of a photoelectric conversion device, an isolation structure also needs to be miniaturized.

SUMMARY OF THE INVENTION

The present disclosure is directed to providing a photoelectric conversion device having a fine isolation structure.

According to an aspect of the embodiments, a photoelectric conversion device includes a semiconductor layer and first and second isolation portions. First and second photoelectric conversion elements are disposed in the semiconductor layer. The semiconductor layer includes a first plane and a second plane placed opposite to the first plane. The first isolation portion is disposed in the semiconductor layer, includes an insulator, and extends from the first plane to a position corresponding to at least a quarter of a length from the first plane to the second plane. The second isolation portion is disposed in the semiconductor layer and extends from the second plane to a position corresponding to at least a quarter of the length from the second plane to the first plane. The first and second isolation portions are disposed between the first and second photoelectric conversion elements.

Further features of the disclosure will become apparent from the following description of exemplary embodiments with reference to the attached drawings.

BRIEF DESCRIPTION OF THE DRAWINGS

FIGS. 8A and 8B are schematic sectional views each illustrating a photoelectric conversion device according to a sixth exemplary embodiment.

DESCRIPTION OF THE EMBODIMENTS

A plurality of exemplary embodiments will be described below. A component of each exemplary embodiment can be added to another exemplary embodiment or replaced with a component of another exemplary embodiment. Further, the disclosure is not limited to the exemplary embodiments described below. In the following description, a P-type semiconductor region is a first conductivity type semiconductor region, and an N-type semiconductor region is a second conductivity type semiconductor region.

Figure 1:
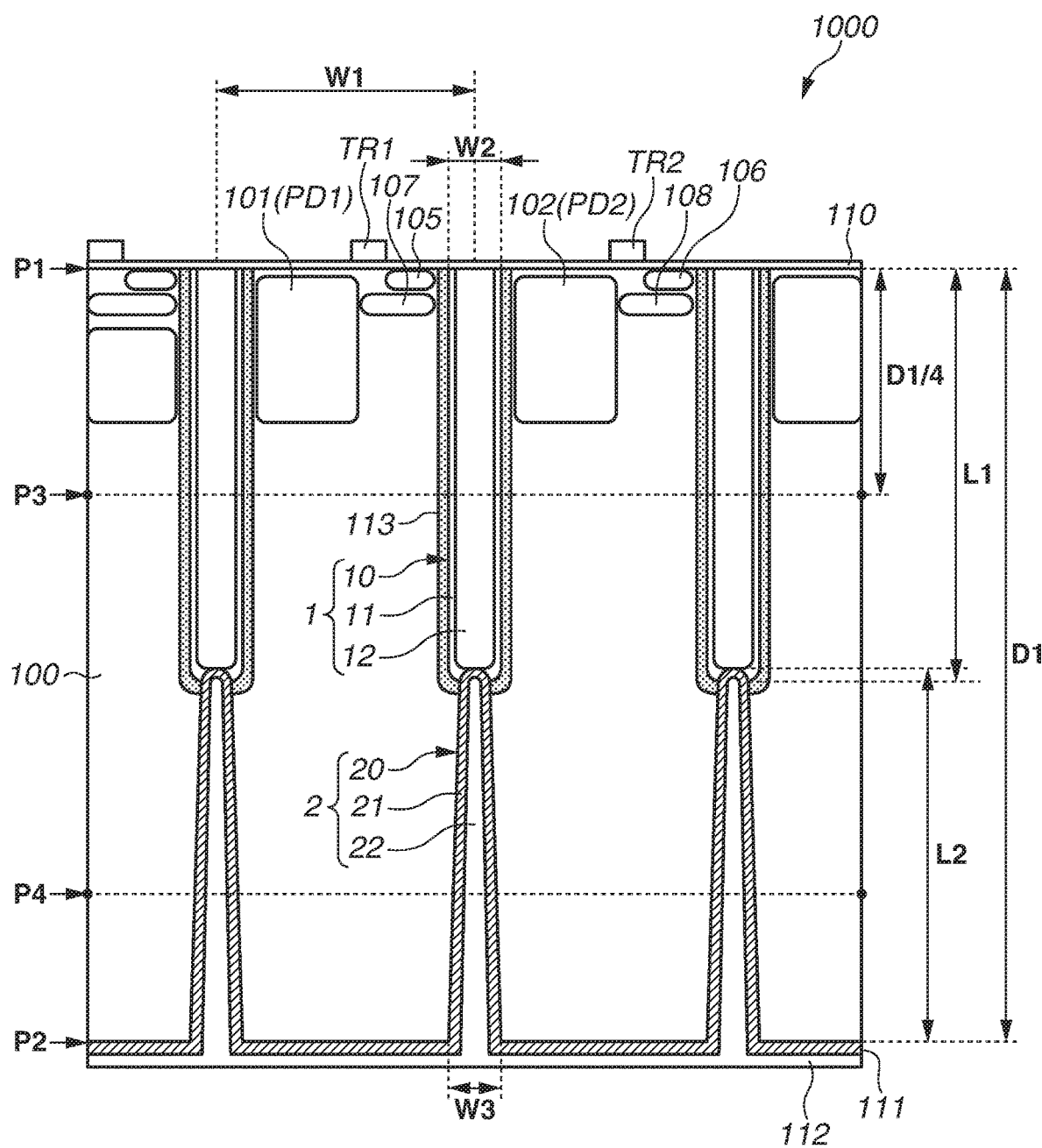
FIG. 1 is a schematic sectional view illustrating a photoelectric conversion device according to a first exemplary embodiment.

A first exemplary embodiment will be described below. FIG. 1 is a schematic sectional view illustrating a photoelectric conversion device according to the present exemplary embodiment. A photoelectric conversion device 1000 is a complementary metal-oxide-semiconductor (CMOS) type image sensor. FIG. 1 illustrates a part of the image sensor with wiring layers and optical elements of the image sensor being omitted.

The photoelectric conversion device 1000 includes at least a semiconductor layer 100. The semiconductor layer 100 includes, for example, silicon. The semiconductor layer 100 includes a first plane P1 and a second plane P2 opposite to the first plane P1. The first plane P1 and the second plane P2 can also be said to be the front surface and the back surface of the semiconductor layer 100, or the interfaces between silicon and other members. The first plane P1 and the second plane P2 includes flat plane portions except for grooves of isolation portions of the semiconductor layer 100. The distance (length) from the first plane P1 to the second plane P2 is D1. Two virtual planes illustrated in FIG. 1 will be described. A third plane P3 is a virtual plane located between the first plane P1 and the second plane P2, along the first plane P1, and at a position corresponding to a quarter of the distance D1 from the first plane P1. A fourth plane P4 is a virtual plane located between the third plane P3 and the second plane P2 and along the first plane P1. The fourth plane P4 is located at a position corresponding to a quarter of the distance D1 from the second plane P2. A "plane" is not limited to a flat plane, and can include a curved plane.

In FIG. 1, the semiconductor layer 100 is, for example, an N-type semiconductor layer. In the semiconductor layer 100, a first photoelectric conversion element PD1 and a second photoelectric conversion element PD2 are provided. Semiconductor regions 101 and 102 are N-type semiconductor regions and can accumulate generated electric charges. Here, "electric charge" means an electric charge to be used as a signal. At least each of the semiconductor regions 101 and 102 and the semiconductor layer 100 forms a P-N junction with another P-type semiconductor region and functions as a photoelectric conversion element. In the description, the semiconductor region 101 is treated as the photoelectric conversion element PD1, and the semiconductor region 102 is treated as the photoelectric conversion element PD2. When the photoelectric conversion device 1000 is used, light is incident from the second plane P2 side, and an electric charge generated by the light is accumulated in the semiconductor region 101 or 102.

On the first plane P1 side of the semiconductor layer 100, a gate electrode TR1 and semiconductor regions 105 and 107 are disposed corresponding to the first photoelectric conversion element PD1. Similarly, on the first plane P1 side of the semiconductor layer 100, a gate electrode TR2 and semiconductor regions 106 and 108 are disposed corresponding to the second photoelectric conversion element PD2. The gate electrodes TR1 and TR2 are the gate electrodes of transfer transistors for transferring electric charges. A first layer 110 can function as a gate insulating film. The first layer 110 includes, for example, oxygen, nitrogen, and hafnium. The semiconductor regions 105 and 106 are arranged on the opposite sides of the semiconductor regions 101 and 102 with respect to the gate electrodes TR1 and TR2 and receive electric charges transferred from the gate electrodes TR1 and TR2, respectively. The semiconductor regions 105 and 106 are also referred to as "floating diffusion regions". The semiconductor regions 107 and 108 extend from below the gate electrodes TR1 and TR2 to below the floating diffusion regions 105 and 106, respectively, and can function as channel stoppers. A single pixel of the photoelectric conversion device 1000 includes at least a photoelectric conversion element and a transfer transistor.

In FIG. 1, between the first photoelectric conversion element PD1 and the second photoelectric conversion element PD2, a first isolation portion 1 and a second isolation portion 2 are provided. The isolation portions are also referred to as an element isolation portion. The first isolation portion 1 is provided in the semiconductor layer 100 and extends from the first plane P1 to at least a position corresponding to a quarter of the distance D1 from the first plane P1. It can also be said that the first isolation portion 1 extends from the first plane P1 to a position past a quarter of the distance D1 from the first plane P1. It can also be said that the first isolation portion 1 extends from the third plane P3 toward the first plane P1. In the present exemplary embodiment, the first isolation portion 1 extends from a position closer to the second plane P2 than the first plane P1 toward the first plane P1 through the third plane P3 and extends to the first plane P1. The second isolation portion 2 is provided in the semiconductor layer 100 and extends from the second plane P2 to at least a position corresponding to a quarter of the distance D1 from the second plane P2. It can also be said that the second isolation portion 2 extends from the second plane P2 to a position past a quarter of the distance D1 from the second plane P2. It can also be said that the second isolation portion 2 extends from the fourth plane P4 to the second plane P2.

Then, the first isolation portion 1 includes portions 11 and 12 in a groove 10. The second isolation portion 2 includes portions 21 and 22 in a groove 20. The grooves 10 and 20 are provided in the semiconductor layer 100, the groove 10 is formed from the first plane P1, and the groove 20 is formed from the second plane P2. Each of the first isolation portion 1 and the second isolation portion 2 includes at least an insulator. The portion 11 includes borosilicate glass (BSG), and the portion 12 includes polysilicon. A semiconductor region 113 includes boron thermally diffused from the BSG. The semiconductor region 113 can have the function of reducing a dark current generated in the groove 10. The portion 21 includes, for example, aluminum oxide, and the portion 22 includes, for example, hafnium oxide. The portions 21 and 22 can function as fixed charge layers. A second layer 111 is the extension of the portion 21 of the second isolation portion 2, and a third layer 112 is the extension of the portion 22 of the second isolation portion 2.

The effects of the present exemplary embodiment will be described below. Even if the first isolation portion 1 is provided in such a manner that the first isolation portion 1 extends from the first plane P1 to the second plane P2, it is possible to isolate the photoelectric conversion elements from each other. However, in a case where the groove 10 is formed with the thickness of the semiconductor layer 100, i.e., a depth of the distance D1, it is difficult to make the width of the groove 10 fine. If a width W1 of a pixel is 1 µm, it is desirable that a width W2 of the groove 10 should be 0.2 µm or less to secure a light-receiving area. Meanwhile, the distance D1 is determined according to the wavelength of light to be detected, and thus cannot be made small with the miniaturization of the pixel. For example, in the case of a photoelectric conversion device for visible light, the distance D1 is 3 µm or less. Thus, it is desirable that the depth of the groove 10 should be about 3 µm. Thus, the aspect ratio of the groove 10 becomes high with the miniaturization of the pixel. A similar issue can arise also in a case where the second isolation portion 2 is similarly provided from the first plane P1 to the second plane P2. In response, as in the present exemplary embodiment, the first isolation portion 1 and the second isolation portion 2 having lengths L1 and L2, respectively, of a quarter or more of the distance D1, are provided between two photoelectric conversion elements, whereby it is possible to obtain a photoelectric conversion device having a fine isolation structure while maintaining isolation performance.

It is desirable that each of the lengths L1 and L2 of the first isolation portion 1 and the second isolation portion 2 should be a quarter or more and three-quarters or less of the distance D1. It is more desirable that the length L2 of the second isolation portion 2 should be a quarter of the distance D1 and the length L1 of the first isolation portion 1 should be greater than or equal to the length of the second isolation portion 2. For the case the two portions are in contact, the distance relationship should be more clearly defined. For example, if the length of the second isolation portion 2 should be a quarter of the distance D1, then length of the first isolation portion 1 should be more than three-quarters of D1 (so that the two can touch each other). Such a configuration achieves sufficient isolation performance while increasing in size the light-receiving areas of photoelectric conversion elements.

In FIG. 1, the first isolation portion 1 and the second isolation portion 2 are in contact, and the second isolation portion 2 is shaped so as to partially bite into the first isolation portion 1. There are the first isolation portion 1 and the second isolation portion 2 at a plane along the third plane P3. In a sectional view of the plane, the second isolation portion 2 is surrounded by the first isolation portion 1. More specifically, an end portion on the first plane P1 side of the second isolation portion 2 is in contact with the portion 12 of the isolation portion 1. In other words, the first isolation portion 1 extends toward the second plane P2 beyond the third plane P3, and the second isolation portion 2 extends toward the first plane P1 beyond the fourth plane P4. Such a configuration enables two photoelectric conversion elements to be further electrically isolated.

In FIG. 1, the width W2 of the first isolation portion 1 on the first plane P1 is greater than a width W3 of the second isolation portion 2 on the second plane P2. Such a configuration can increase in size the areas of the incidence of light on photoelectric conversion elements, thus contributing to an improvement in sensitivity. The width on the first plane P1 or the second plane P2 indicates a length at any section (FIG. 1) and refers to the minimum width between these elements.

In FIG. 1, suppose the distance D1=2400 nm, if the first isolation portion 1 has a length of 1300 nm and a width of 120 nm, the second isolation portion 2 can have a length of 1200 nm and a width of 100 nm. In such a case, an overlapping portion of the first isolation portion 1 and the second isolation portion 2 is assumed to be 100 nm. Such a relationship can provide fine isolation in even a fine pixel having a pixel size of about 1 μm. Moreover, with such a width relationship, the first isolation portion 1 can deal with a positional shift as an etching stopper used in forming the second isolation portion 2.

A second exemplary embodiment will be described below. FIGS. 2A to 3B are schematic diagrams illustrating a photoelectric conversion device according to the present exemplary embodiment. The photoelectric conversion device according to the present exemplary embodiment is also a CMOS-type image sensor, but is different from that according to the first exemplary embodiment in terms of, for example, the structure of a transfer transistor. In the description of the present exemplary embodiment, components having functions similar to those in FIG. 1 are designated with the same signs, and are not described here.

Figure 2A:
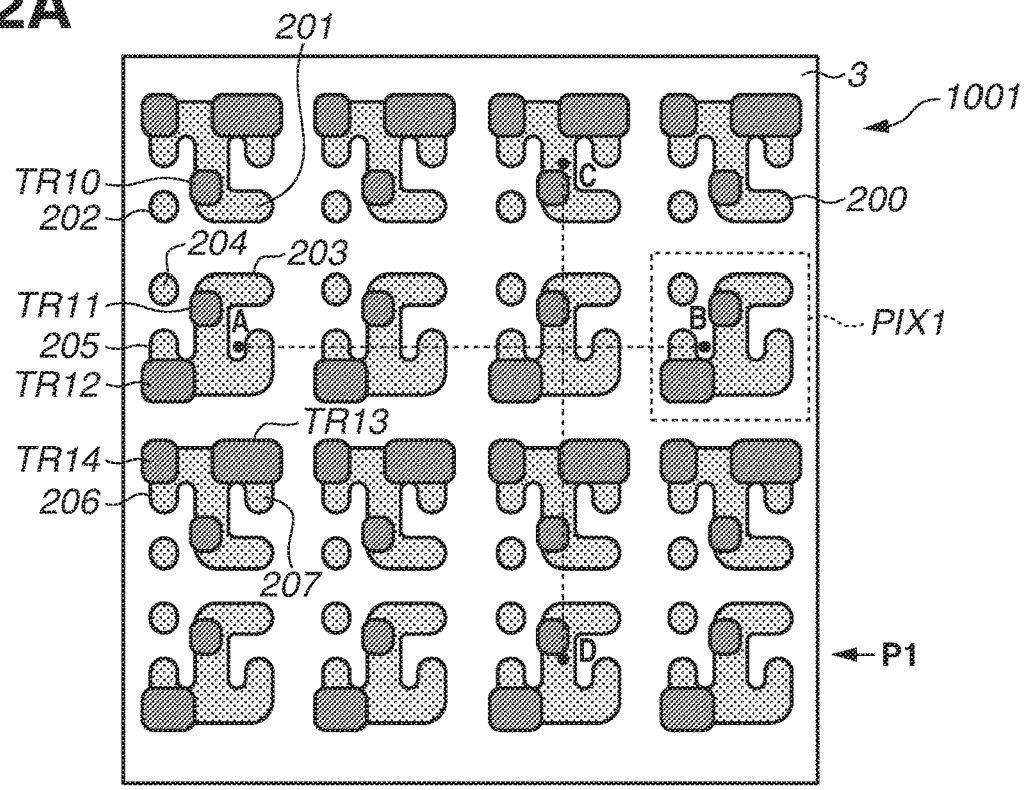
FIGS. 2A and 2B are schematic plan views each illustrating a photoelectric conversion device according to a second exemplary embodiment.

FIG. 2A is a schematic plan view of a photoelectric conversion device 1001 according to the present exemplary embodiment. In FIG. 2A, the photoelectric conversion device 1001 has a configuration in which pixels, each including a single photoelectric conversion element, are arranged in four rows and four columns, and two pixels adjacent to each other in the column direction share some elements.

Figure 3A:
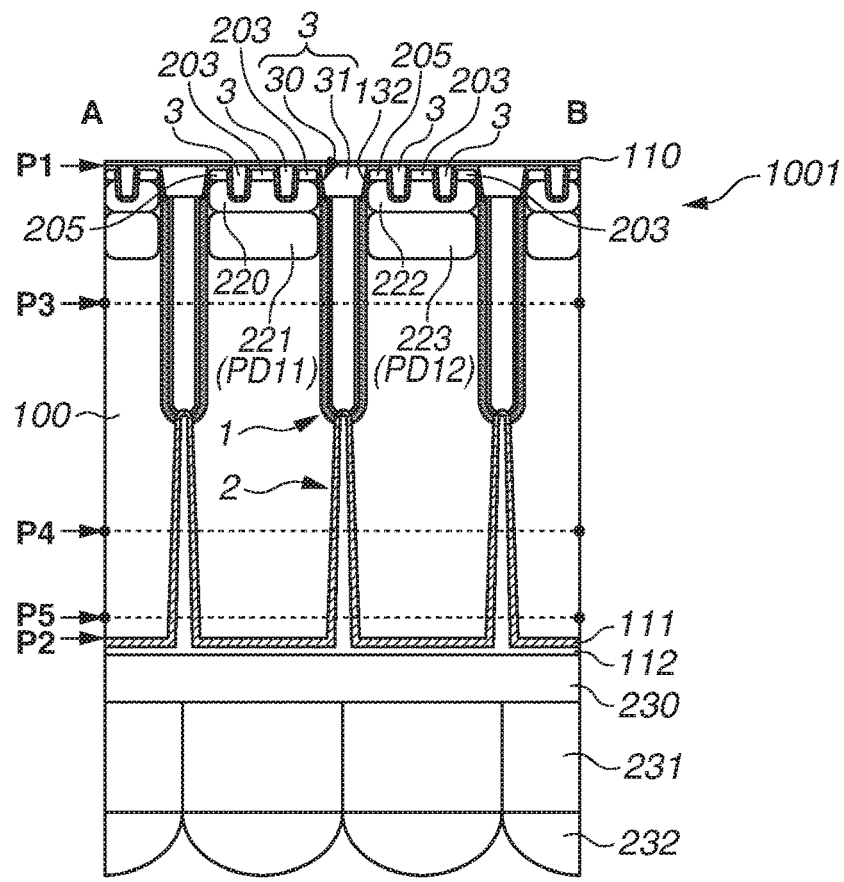
FIGS. 3A and 3B are schematic sectional views each illustrating the photoelectric conversion device according to the second exemplary embodiment.
Figure 3B:
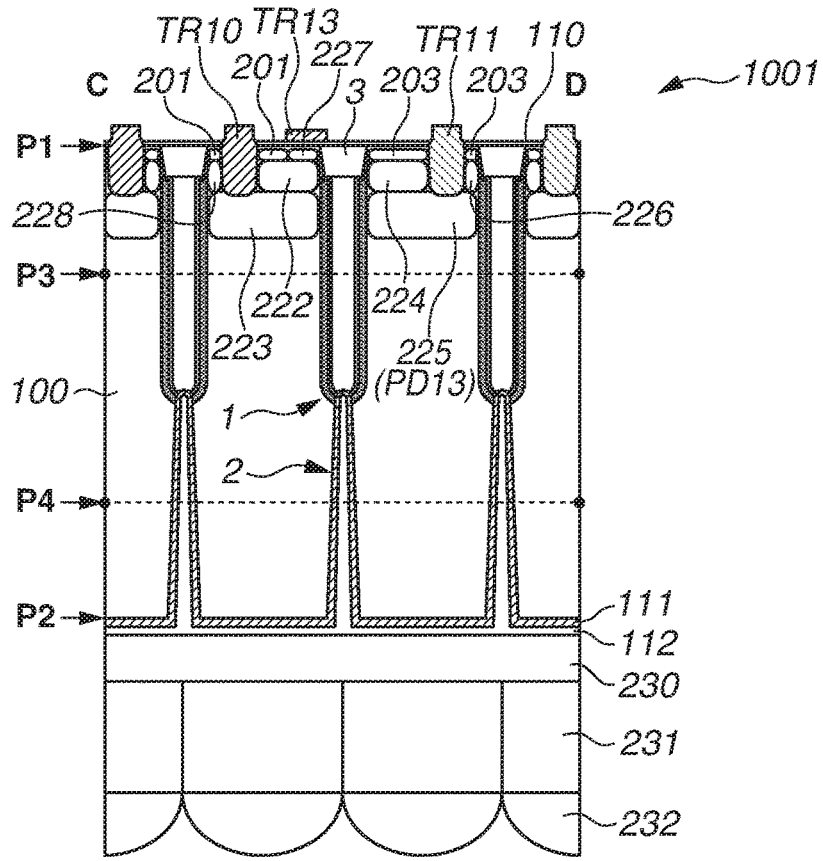

FIG. 2A is a schematic plan view illustrating the shapes of the projections of a third isolation portion 3, an active region 200, and gate electrodes onto a first plane P1 (see FIGS. 3A and 3B). In the active region 200, elements including a photoelectric conversion element are placed. In the following description, a first isolation portion 1 and the third isolation portion 3 will be described as separate portions, but the first isolation portion 1 includes the third isolation portion 3.

Gate electrodes TR10 and TR11 are the gate electrodes of transfer transistors. Semiconductor regions 201 and 203 can function as floating diffusion regions. The gate electrode TR10 transfers an electric charge generated in a photoelectric conversion element (not illustrated in FIG. 2A) to the semiconductor region 201. Similarly, the gate electrode TR11 transfers an electric charge generated in a photoelectric conversion element to the semiconductor region 203. The semiconductor regions 201 and 203 are electrically connected to a gate electrode TR13 by, for example, contact plugs and wiring. The gate electrode TR13 is the gate electrode of an amplification transistor. Signals based on electric charges from the two photoelectric conversion elements are read from a semiconductor region 207, which is the source of the amplification transistor. A gate electrode TR12 is the gate electrode of a reset transistor. Turning on of the gate electrode TR12 resets the semiconductor region 203, the semiconductor region 201, and the gate electrode TR13 based on a voltage supplied to a semiconductor region 205. The semiconductor region 201 and the gate electrode TR13 are electrically connected to the semiconductor region 203. A gate electrode TR14 is the gate electrode of a selection transistor. Turning on of the gate electrode TR14 supplies any voltage supplied to a semiconductor region 206, e.g., a power supply voltage in this case, to the amplification transistor. Semiconductor regions 202 and 204 are portions to which wells where the transistors are provided and contact plugs are connected. A ground potential is supplied to the semiconductor regions 202 and 204.

Referring now to FIGS. 3A and 3B, the sectional structure of the photoelectric conversion device 1001 will be described. FIG. 3A is a schematic sectional view of the photoelectric conversion device 1001 taken along a line A-B in FIG. 2A. FIG. 3B is a schematic sectional view of the photoelectric conversion device 1001 taken along a line C-D in FIG. 2A. The photoelectric conversion device 1001 includes a semiconductor layer 100 similar to that in FIG. 1. Between photoelectric conversion elements, a first isolation portion 1 and a second isolation portion 2 are provided. The photoelectric conversion device 1001 includes a third isolation portion 3 provided in contact with the first isolation portion 1 on a perpendicular (not illustrated) to a first plane P1 and between the first isolation portion 1 and the first plane P1. In other words, on a perpendicular to the first plane P1, the third isolation portion 3, the first isolation portion 1, and the second isolation portion 2 are arranged in this order from the first plane P1 toward a second plane P2. Such a configuration enables elements to be isolated more strongly.

The third isolation portion 3 includes an insulator and is formed by a groove 30 in the semiconductor layer 100 and a portion 31 in the groove 30. The portion 31 includes, for example, silicon oxide. Around the third isolation portion 3, a semiconductor region 132 is provided. The semiconductor region 132 is of a P-type and can have the function of reducing the mixing of a dark current generated in the groove 30 into an electric charge as a signal.

The details of the photoelectric conversion device 1001 illustrated in FIGS. 3A and 3B will be described below. In the semiconductor layer 100, at least photoelectric conversion elements PD11, PD12, and PD13 are provided. Semiconductor regions 221, 223, and 225 are N-type semiconductor regions and are regions for accumulating electric charges generated in the photoelectric conversion elements PD11, PD12, and PD13, respectively. The photoelectric conversion element PD11 includes the semiconductor region 221. The photoelectric conversion element PD12 includes the semiconductor region 223. The photoelectric conversion element PD13 includes the semiconductor region 225. As in the first exemplary embodiment, in the description, each semiconductor region is occasionally treated as a photoelectric conversion element. Semiconductor regions 220, 222, and 224 are P-type semiconductor regions and can function as the wells of transistors. Semiconductor regions 226, 227, and 228 are first conductivity type semiconductor regions and are regions where the channels of transistors are formed. In FIGS. 3A and 3B, the gate electrodes TR10 and TR11 extend further inside the semiconductor layer 100 beyond the first plane P1 than the gate electrode TR13. With the gate electrode TR10 having such a shape, an electric charge of the semiconductor region 223 is transferred to the semiconductor region 201 via the semiconductor region 228 where the channel is formed. Similarly, for the gate electrode TR11, an electric charge of the semiconductor region 225 is transferred to the semiconductor region 203 via the semiconductor region 226.

In the present exemplary embodiment, the first isolation portion 1 and the second isolation portion 2 are also provided between the photoelectric conversion elements PD11 and PD12 and between the photoelectric conversion elements PD12 and PD13, as in the first exemplary embodiment. As in the first exemplary embodiment, the first isolation portion 1 is disposed in the semiconductor layer 100 and extends at least from a third plane P3 toward the first plane P1. In the present exemplary embodiment, the first isolation portion 1 extends to a position where the first isolation portion 1 contacts with the third isolation portion 3. Similarly, the second isolation portion 2 is also disposed in the semiconductor layer 100 and extends at least from a fourth plane P4 to the second plane P2. Thus, the configuration according to the present exemplary embodiment can provide a photoelectric conversion device having a fine isolation structure, as in the first exemplary embodiment.

Figure 2B:
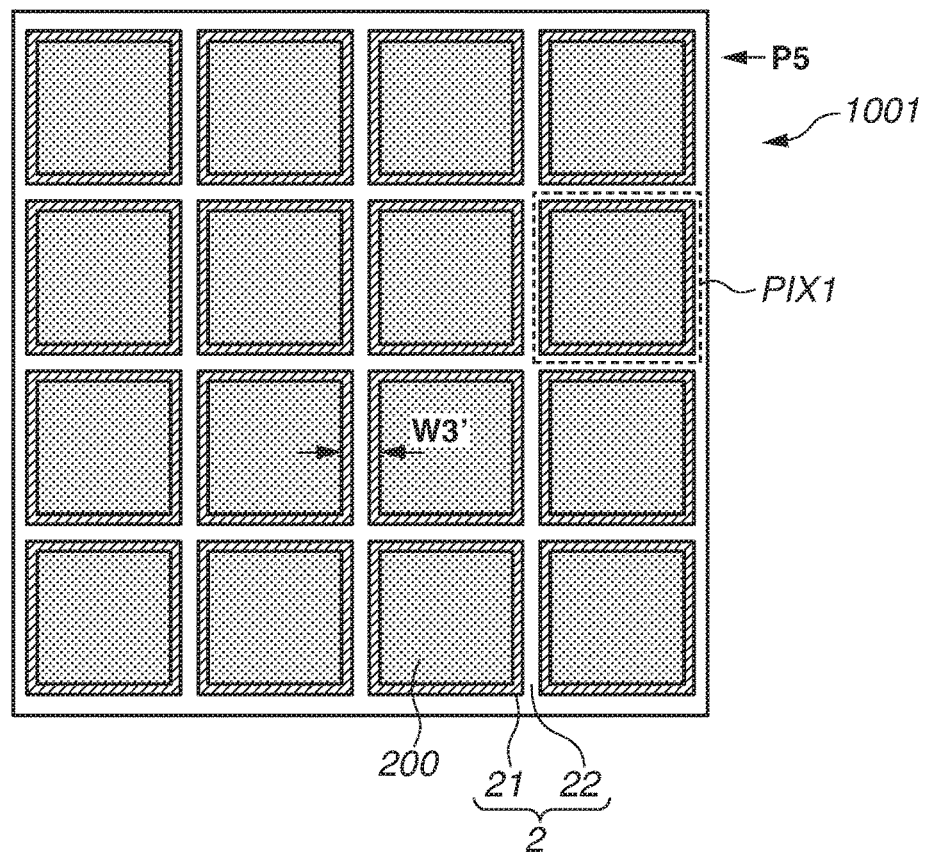

FIG. 2B is a schematic plan view illustrating a configuration on a fifth plane P5 illustrated in FIG. 3A. FIG. 2B illustrates the shape of the second isolation portion 2 and illustrates an active region 200 and portions 21 and 22 of the second isolation portion 2. The second isolation portion 2 is provided in a grid, and a photoelectric conversion element is placed in each active region 200. A pixel PIX1 illustrated in FIG. 2B includes at least one photoelectric conversion element and corresponds to a pixel PIX1 illustrated in FIG. 2A. Also in the present exemplary embodiment, providing of the first isolation portion 1 and the second isolation portion 2 between two photoelectric conversion elements enables a width W3' of the second isolation portion 2 on the fifth plane P5 to be narrower, as illustrated in FIG. 2B.

Referring now to FIGS. 3A and 3B, on the second plane P2 side, a fourth film 230, a color filter layer 231, and a microlens layer 232 including a plurality of lenses are provided. These components are a known technique, and thus are not described in detail here. This configuration can also be applied to the first exemplary embodiment.

In the present exemplary embodiment, a description has been provided of a CMOS-type image sensor different from that according to the first exemplary embodiment in the structure of a transfer transistor. Furthermore, in the present exemplary embodiment, a description has been provided of a configuration in which a third isolation portion is provided in addition to the isolation structure according to the first exemplary embodiment. Such a configuration also can provide a photoelectric conversion device having a fine isolation structure as in the first exemplary embodiment.

Figure 4A:
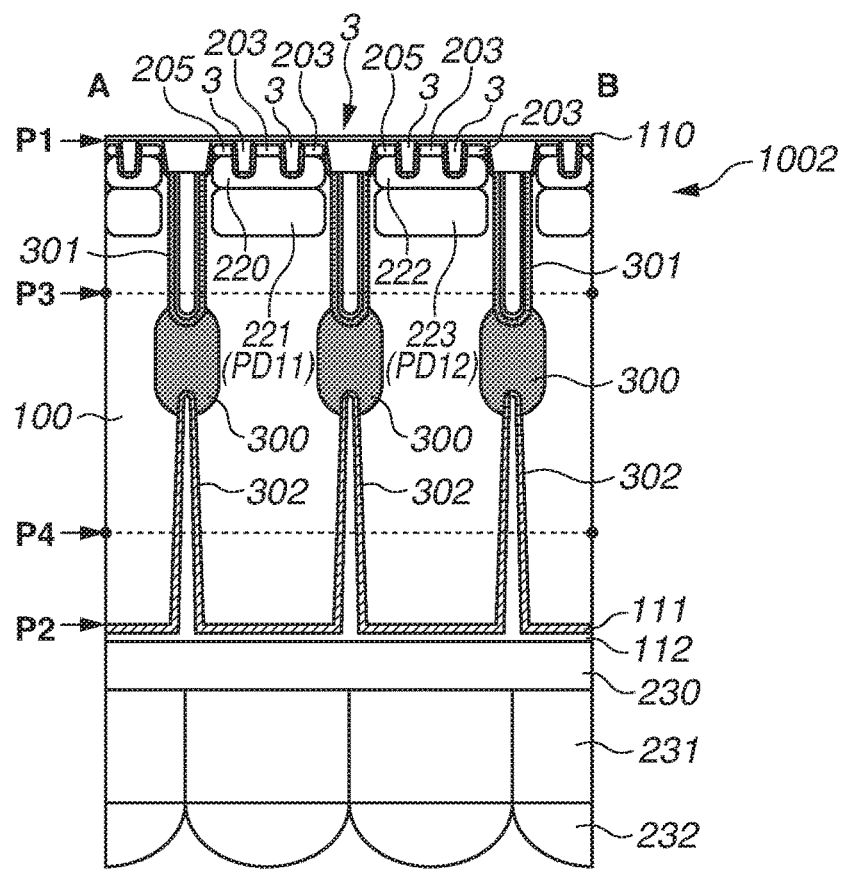
FIGS. 4A and 4B are schematic sectional views each illustrating a photoelectric conversion device according to a third exemplary embodiment.

A third exemplary embodiment will be described below. With reference to FIG. 4A, a photoelectric conversion device according to the present exemplary embodiment will be described below. FIG. 4A is a schematic sectional view of a photoelectric conversion device 1002 corresponding to FIG. 3A. In the description of FIG. 4A, components similar to those in FIG. 3A are designated with the same signs, and are not described here. The photoelectric conversion device 1002 according to the present exemplary embodiment is different from the photoelectric conversion device 1001 in FIG. 3A in that a first isolation portion 301 and a second isolation portion 302 are separate from each other, and between the first isolation portion 301 and the second isolation portion 302, a semiconductor region 300 is provided. The semiconductor region 300 may be, for example, a P-type semiconductor region, and may function as a potential barrier against electric charges generated and accumulated in photoelectric conversion elements. The semiconductor region 300 is in contact with the first isolation portion 301 and the second isolation portion 302. With such a configuration, it is possible to form the first isolation portion 301 and the second isolation portion 302 to be shallower than those in the first and second exemplary embodiments, enabling the widths of the first isolation portion 301 and the second isolation portion 302 to be further narrowed. Particularly, narrowing of the width of the second isolation portion 302 leads to increasing the areas and the volumes of photoelectric conversion elements. This can improve sensitivity. Furthermore, a defect and damage due to the formation of the first isolation portion 301 or the second isolation portion 302 are reduced. Thus, it is possible to reduce a dark current generated by, for example, the defect. The structures of the first isolation portion 301 and the second isolation portion 302 are similar to those according to the other exemplary embodiments described above, and therefore are not described here.

Figure 4B:
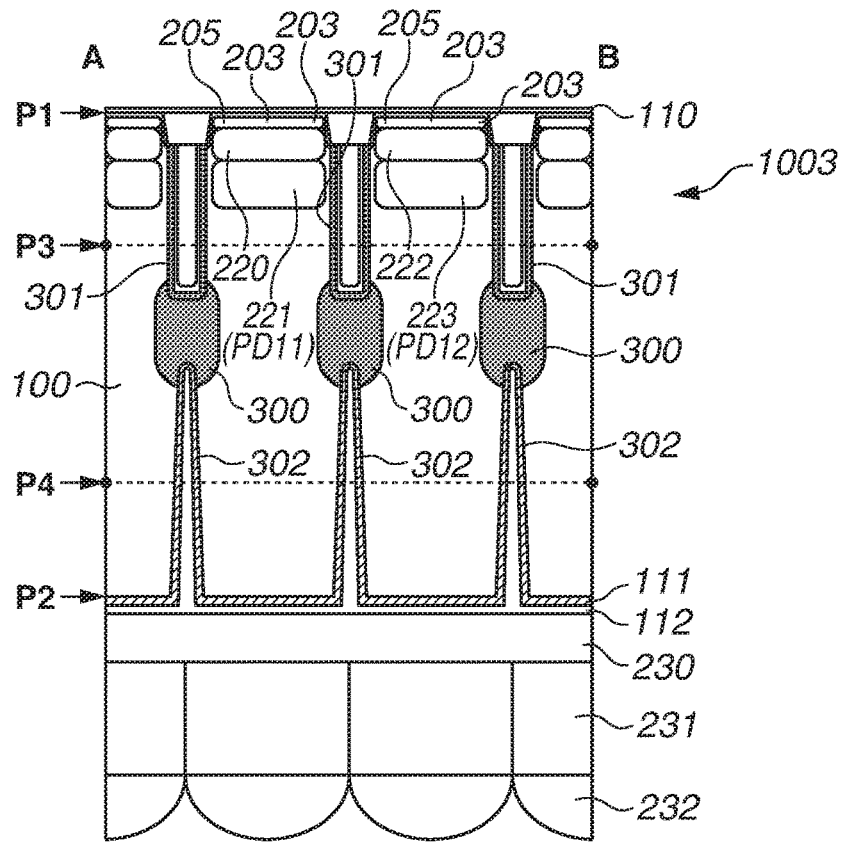

FIG. 4B is a schematic diagram illustrating a variation of the present exemplary embodiment. A photoelectric conversion device 1003 in FIG. 4B is different from the photoelectric conversion device 1002 illustrated in FIG. 4A in that the third isolation portion 3 that is in contact with the first isolation portion 301 is not provided. Such a configuration enables the width of an isolation portion on the first plane P1 to be narrowed. Thus, it is possible to make a formation region wide.

Also in the photoelectric conversion device 1002 in FIG. 4A, if the first isolation portion 301 is formed after the third isolation portion 3 is formed first, a structure as illustrated in FIG. 4B may be obtained. More specifically, it seems as if only the first isolation portion 301 is provided between two photoelectric conversion elements on the first plane P1 side.

Figure 5A:
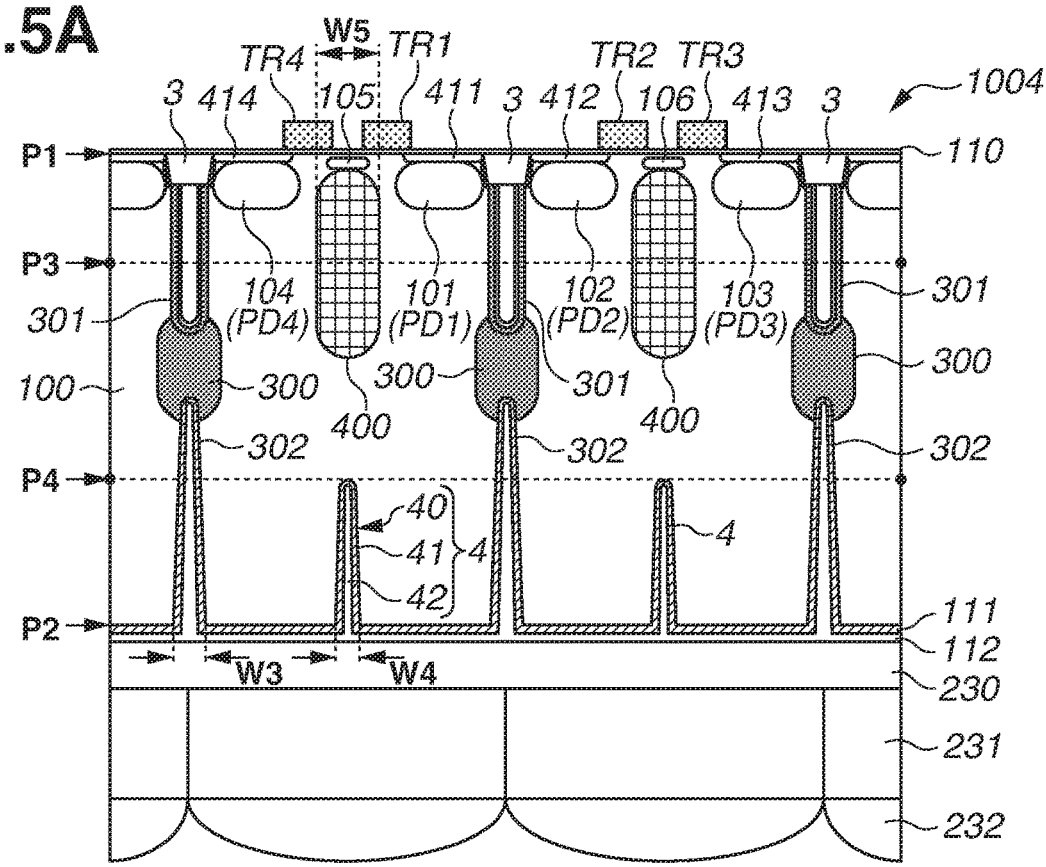
FIGS. 5A and 5B are schematic sectional views each illustrating a photoelectric conversion device according to a fourth exemplary embodiment.

With reference to FIG. 5A, a fourth exemplary embodiment will be described. FIG. 5A is a schematic sectional view of a photoelectric conversion device 1004. The photoelectric conversion device 1004 has a configuration with the configurations in FIGS. 1 and 4A being appropriately combined and modified. In the description of FIG. 5A, components similar to those in FIGS. 1 and 4A are designated with the same signs, and are not described here.

In FIG. 5A, a semiconductor layer 100 includes a first photoelectric conversion element PD1 and a second photoelectric conversion element PD2 as in FIG. 1. In FIG. 5A, the semiconductor layer 100 further includes a third photoelectric conversion element PD3 and a fourth photoelectric conversion element PD4. The third photoelectric conversion element PD3 includes a second conductivity type semiconductor region 103, and an electric charge is transferred from the semiconductor region 103 to a semiconductor region 106 by a gate electrode TR3. The fourth photoelectric conversion element PD4 includes a second conductivity type semiconductor region 104, and an electric charge is transferred from the semiconductor region 104 to a semiconductor region 105 by a gate electrode TR4. That is, the pair of the first photoelectric conversion element PD1 and the fourth photoelectric conversion element PD4 share the semiconductor region 105, and the pair of the second photoelectric conversion element PD2 and the third photoelectric conversion element PD3 share the semiconductor region 106. In the present exemplary embodiment, these pairs also share other transistors such as an amplification transistor and a reset transistor (not illustrated). Semiconductor regions 411, 412, 413, and 414 are P-type semiconductor regions and can function as parts of photoelectric conversion elements. In FIG. 5A, a single microlens of a microlens layer 232 is disposed corresponding to at least two photoelectric conversion elements. With such a configuration, it is possible to obtain a signal for focus detection.

In FIG. 5A, between the first photoelectric conversion element PD1 and the second photoelectric conversion element PD2 of the semiconductor layer 100, a first isolation portion 301 and a second isolation portion 302 are disposed. The first isolation portion 301 and the second isolation portion 302 are disposed separately from each other, and between the first isolation portion 301 and the second isolation portion 302, a semiconductor region 300 is provided. This isolation structure is similar to that in FIG. 4A.

In FIG. 5A, between the second photoelectric conversion element PD2 and the third photoelectric conversion element PD3 provided in the semiconductor layer 100, a fourth isolation portion 4 is provided. Similarly, between the first photoelectric conversion element PD1 and the fourth photoelectric conversion element PD4, a fourth isolation portion 4 is provided. Each fourth isolation portion 4 is provided in the semiconductor layer 100 and extends from a second plane P2 to a fourth plane P4. As with the second isolation portion 302, the fourth isolation portion 4 includes a groove 40 and portions 41 and 42.

That is, in the photoelectric conversion device 1004 in FIG. 5A, a fourth isolation portion 4 is provided between a plurality of photoelectric conversion elements provided corresponding to a single microlens. A first isolation portion 301 and a second isolation portion 302 are provided between the plurality of photoelectric conversion elements provided corresponding to the single microlens and a plurality of photoelectric conversion elements provided corresponding to another microlens.

Such a configuration facilitates the guiding of an electric charge generated by light incident from the microlens layer 232 to each photoelectric conversion element, thus improving the accuracy of focus detection. It is desirable to align a position on the second plane P2 (the position in the horizontal direction in FIG. 5A) of each fourth isolation portion 4 with the focal position of the corresponding microlens. This configuration enhances the accuracy of focus detection.

In the present exemplary embodiment, the second isolation portion 302 extends from the second plane P2 through the fourth plane P4, and the fourth isolation portion 4 extends from the second plane P2 to the fourth plane P4. That is, the second isolation portion 302 is longer than the fourth isolation portion 4. Additionally, a width W4 of the fourth isolation portion 4 on the second plane P2 is narrower than a width W3 of the second isolation portion 302. In such a manner, the isolation properties of an isolation portion provided between first and second photoelectric conversion elements that do not share a single microlens are made higher than those of an isolation portion provided between the second photoelectric conversion element and a third photoelectric conversion element that share a single microlens. Consequently, it is possible to obtain an image signal having high accuracy.

The photoelectric conversion device 1004 according to the present exemplary embodiment includes a semiconductor region 400 on a first plane P1 side opposite to the fourth isolation portion 4. The semiconductor region 400 may be, for example, a P-type semiconductor region and may function as a potential barrier against electric charges generated and accumulated in photoelectric conversion elements. Providing of the semiconductor region 400 enhances the isolation performance of a focus detection signal, thus further enhancing the accuracy of focus detection. The width W4 of the fourth isolation portion 4 on the second plane P2 is narrower than a width W5 of the semiconductor region 400 on the first plane P1. Such a configuration enhances sensitivity while maintaining isolation performance. The length of the semiconductor region 400 from the first plane P1 may be shorter than the length of the first isolation portion 1 from the first plane P1.

Further, in FIG. 5A, the fourth isolation portion 4 and the semiconductor region 400 are separate, but may be in contact with each other. With a configuration in which the fourth isolation portion 4 and the semiconductor region 400 are separate, for example, even if the second photoelectric conversion element PD2 becomes saturated and electric charges overflow, the electric charges move to the third photoelectric conversion element PD3. This enables the mixing of electric charges into the first photoelectric conversion element PD1 to be further reduced.

Figure 5B:
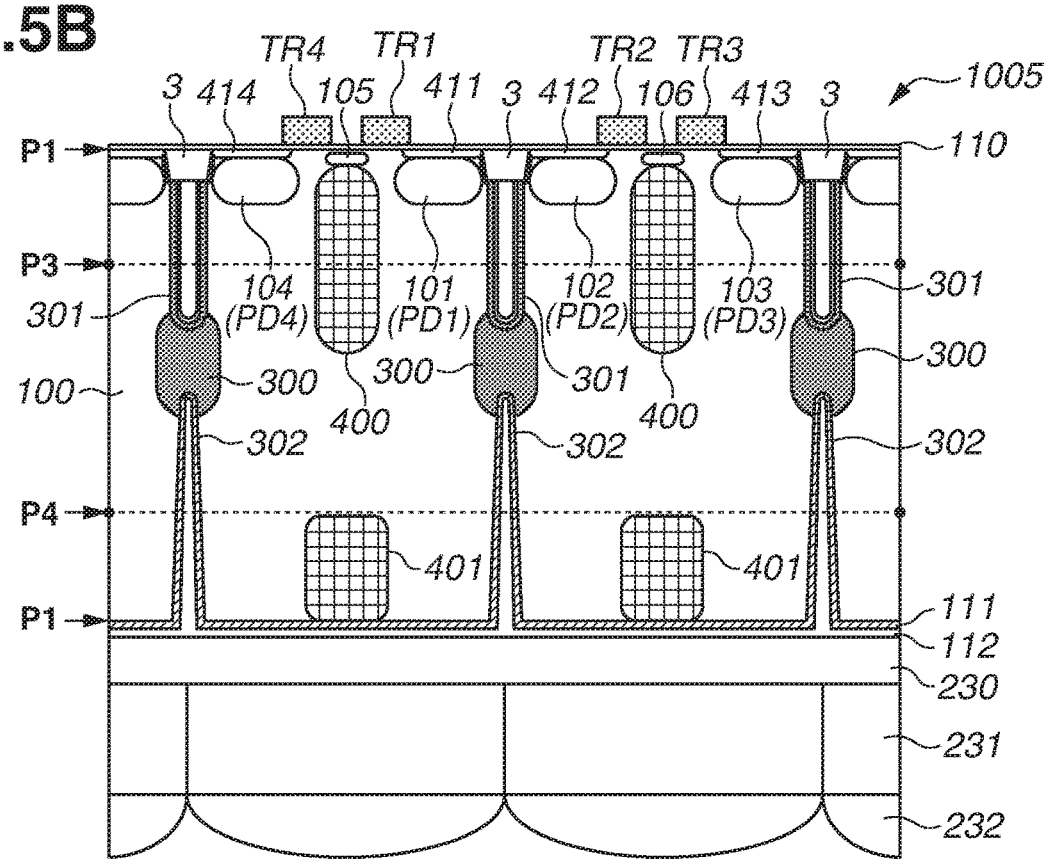

Next, FIG. 5B illustrates a photoelectric conversion device 1005, which is a variation of the present exemplary embodiment. In FIG. 5B, the fourth isolation portion 4 illustrated in FIG. 5A is replaced with a semiconductor region 401. Replacement of the fourth isolation portion 4 with the semiconductor region 401, that is, the absence of the fourth isolation portion 4, improves sensitivity although the accuracy of focus detection decreases.

Figure 6A:
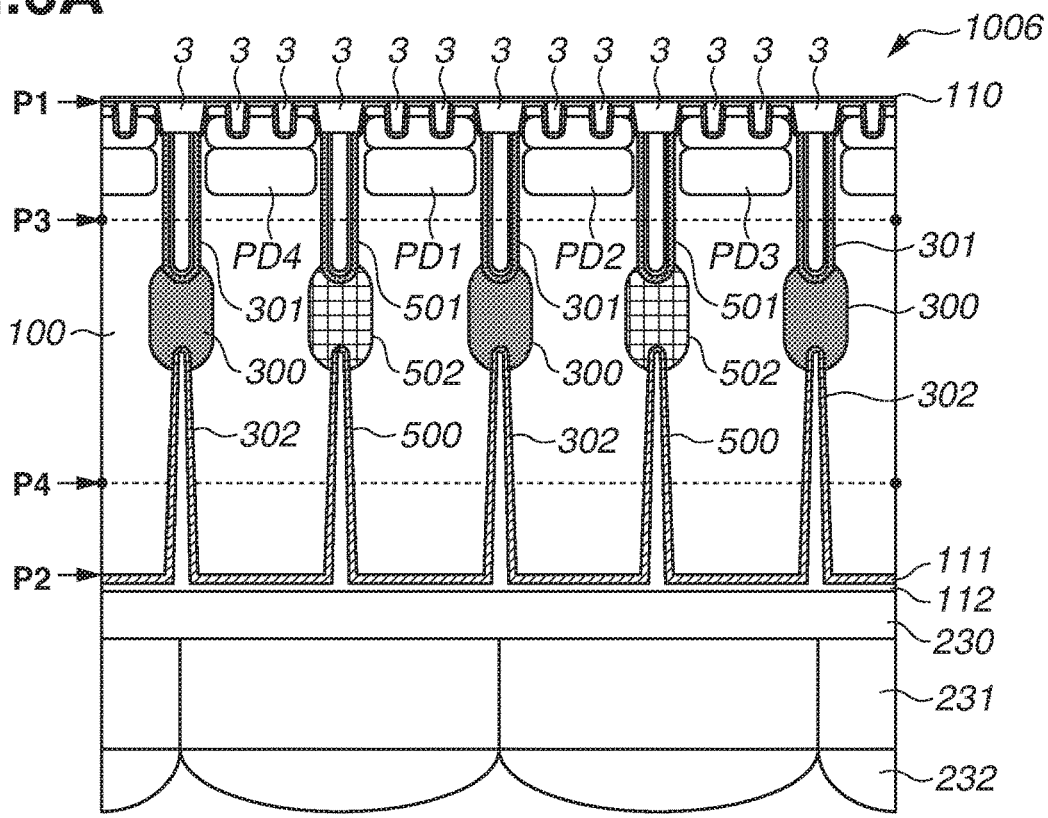
FIGS. 6A and 6B are schematic sectional views each illustrating a photoelectric conversion device according to a fifth exemplary embodiment.

With reference to FIGS. 6A to 7B, a fifth exemplary embodiment will be described below. First, a photoelectric conversion device 1006 in FIG. 6A will be described. FIG. 6A is a schematic sectional view of the photoelectric conversion device 1006. The photoelectric conversion device 1006 has a configuration with the configurations in FIGS. 4A and 5A being appropriately combined and modified. In the description of FIG. 6A, components similar to those in FIGS. 4A and 5A are designated with the same signs, and are not described here.

In FIG. 6A, in a semiconductor layer 100, a first photoelectric conversion element PD1 to a fourth photoelectric conversion element PD4 are disposed as in FIG. 5A. The structures of the photoelectric conversion elements in FIG. 6A are similar to those of the photoelectric conversion elements illustrated in FIG. 4A, and thus are not described in detail here. Portions in FIG. 6A corresponding to the semiconductor regions 221 and 223 in FIG. 4A are designated by "PD1" to "PD4". In FIG. 6A as well, the first photoelectric conversion element PD1 and the fourth photoelectric conversion element PD4 are provided for a single microlens, and the second photoelectric conversion element PD2 and the third photoelectric conversion element PD3 are provided for a single microlens. With the photoelectric conversion device 1006 according to the present exemplary embodiment, it is also possible to obtain a signal for focus detection.

In FIG. 6A, between the first photoelectric conversion element PD1 and the second photoelectric conversion element PD2, a first isolation portion 301 and a second isolation portion 302 are disposed. The first isolation portion 301 and the second isolation portion 302 are separately disposed, and between the first isolation portion 301 and the second isolation portion 302, a semiconductor region 300 is provided. This isolation structure is similar to that in FIG. 5A. In FIG. 6A, between the second photoelectric conversion element PD2 and the third photoelectric conversion element PD3 and between the first photoelectric conversion element PD1 and the fourth photoelectric conversion element PD4, a fourth isolation portion 500 and a fifth isolation portion 501 are further disposed. The fourth isolation portion 500 and the fifth isolation portion 501 are separately disposed, and between the fourth isolation portion 500 and the fifth isolation portion 501, a semiconductor region 502 is provided. The semiconductor region 502 may be, for example, a P-type semiconductor region and may function as a potential barrier against electric charges generated and accumulated in photoelectric conversion elements.

The fourth isolation portion 500 is disposed in the semiconductor layer 100, extends from a second plane P2 through a fourth plane P4, and has a length equal to that of the second isolation portion 302. The fifth isolation portion 501 is disposed in the semiconductor layer 100, extends at least from a third plane P3 toward a first plane P1, and has a length equal to that of the first isolation portion 301. In the present exemplary embodiment, the fourth isolation portion 500 has a structure equivalent to that of the second isolation portion 302, and the fifth isolation portion 501 has a structure equivalent to that of the first isolation portion 301. Thus, the fourth isolation portion 500 and the fifth isolation portion 501 are not described here.

The barrier function of the semiconductor region 502 as a potential barrier is lower than that of the semiconductor region 300. For example, the semiconductor region 502 has a lower impurity concentration than the semiconductor region 300. That is, the isolation performance between first and second photoelectric conversion elements is higher than the isolation performance between the second photoelectric conversion element and a third photoelectric conversion element. As in the fourth exemplary embodiment, such a configuration enhances the isolation performance of a focus detection signal, thus further enhancing the accuracy of focus detection. A case has been illustrated where the semiconductor region 502 has an impurity concentration lower than the semiconductor region 300. Alternatively, the width of the semiconductor region 502 may be narrower than that of the semiconductor region 300, or the length (the length from the first plane P1 to the second plane P2) of the semiconductor region 502 may be shorter than that of the semiconductor region 300, or these configurations may be combined together.

Figure 6B:
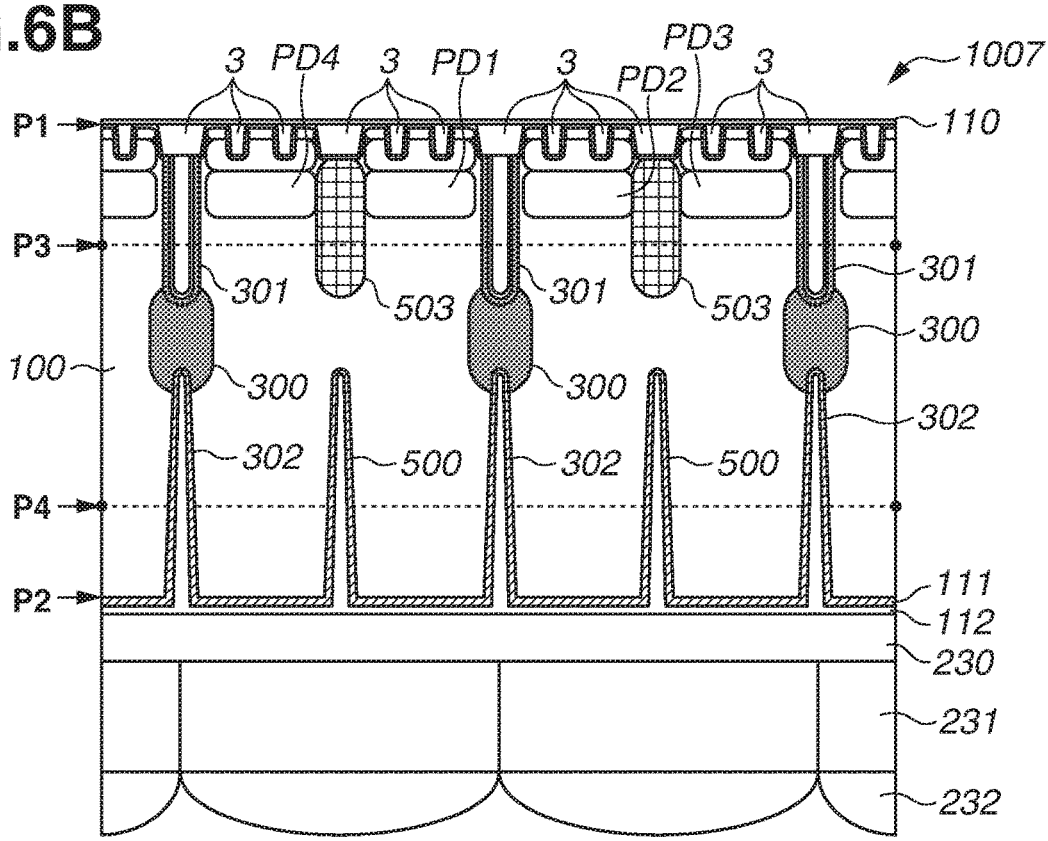

Referring now to FIG. 6B, a variation of the present exemplary embodiment will be described. FIG. 6B is a schematic sectional view of a photoelectric conversion device 1007. In FIG. 6B the fifth isolation portion 501 illustrated in FIG. 6A is replaced with a semiconductor region 503, and the semiconductor region 502 is not provided. The semiconductor region 503 may be, for example, a P-type semiconductor region and may function as a potential barrier against electric charges generated and accumulated in photoelectric conversion elements. The semiconductor region 503 is provided in contact with a lower portion of a third isolation portion 3. For example, since the fifth isolation portion 501 is not formed, it is possible to reduce a dark current due to the formation of the fifth isolation portion 501.

Figure 7A:
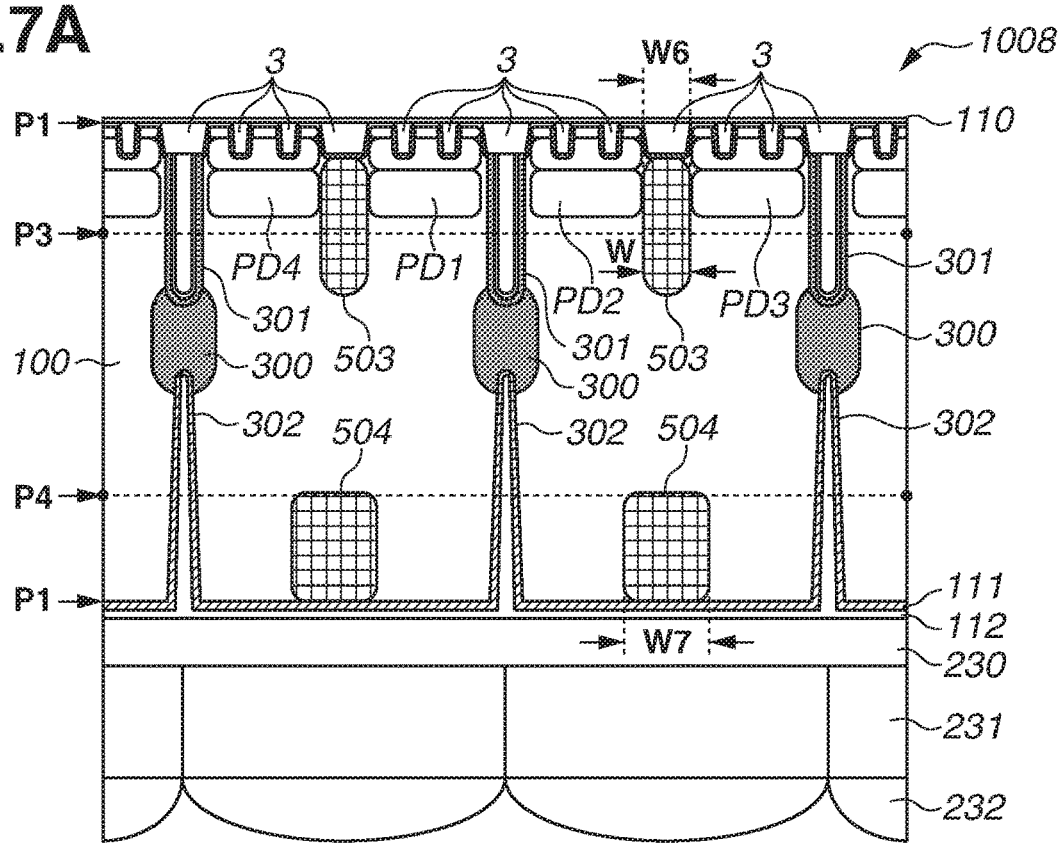
FIGS. 7A and 7B are schematic sectional views each illustrating a photoelectric conversion device according to the fifth exemplary embodiment.

Referring now to FIG. 7A, another variation of the present exemplary embodiment will be described. FIG. 7A is a schematic-sectional view of a photoelectric conversion device 1008. In FIG. 7A, the fourth isolation portion 500 illustrated in FIG. 6B is replaced with a semiconductor region 504. The semiconductor region 504 may be, for example, a P-type semiconductor region and may function as a potential barrier against electric charges generated and accumulated in photoelectric conversion elements. Since the fourth isolation portion 500 is not formed, it is possible to reduce a dark current due to the formation of the fourth isolation portion 500. Additionally, the sensitivity of a photoelectric conversion element is improved.

A width W6 of the projection of a semiconductor region 503 onto a first plane P1 is narrower than a width W7 of the projection of the semiconductor region 504 onto a second plane P2.

Figure 7B:
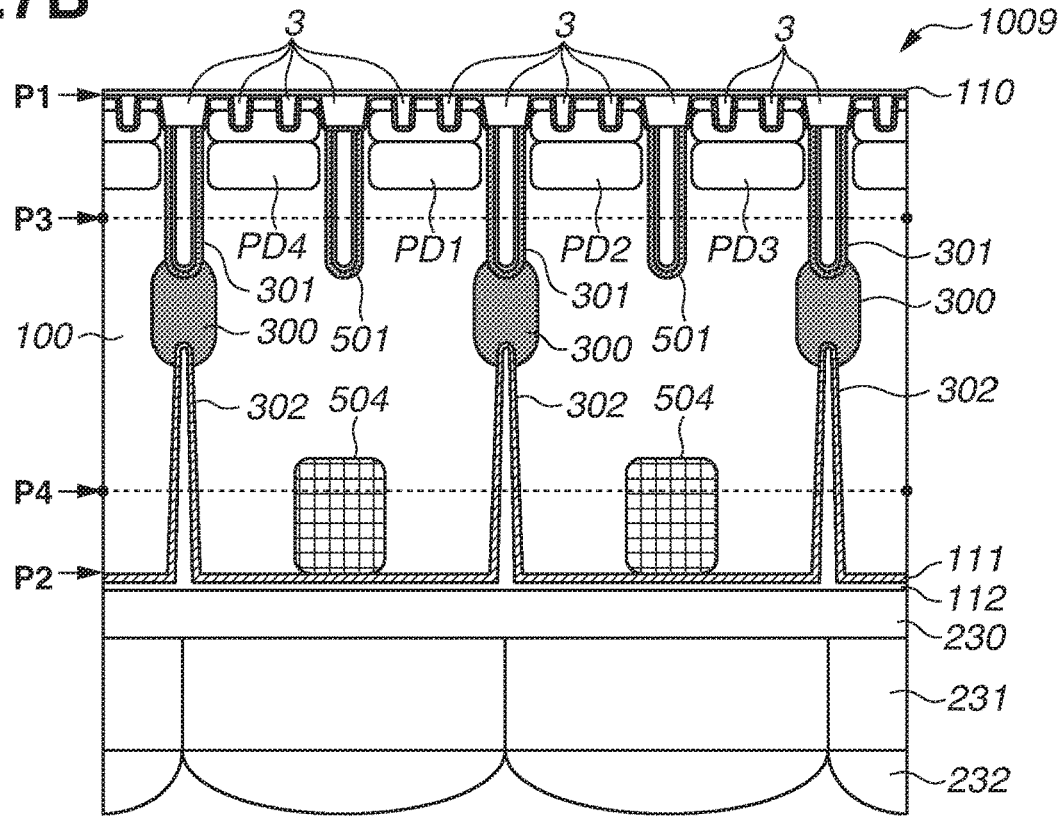

Referring now to FIG. 7B, another variation of the present exemplary embodiment will be described. FIG. 7B is a schematic sectional view of a photoelectric conversion device 1009. In FIG. 7B the semiconductor region 503 illustrated in FIG. 7A is replaced with the fifth isolation portion 501 illustrated in FIG. 6A. As compared with FIG. 6A, since the fourth isolation portion 500 is not formed, it is possible to reduce a dark current due to the formation of the fourth isolation portion 500. Additionally, the sensitivity of a photoelectric conversion element is improved.

Referring now to FIGS. 8A and 8B, a photoelectric conversion device according to a sixth exemplary embodiment will be described. FIG. 8A is a schematic sectional view of a photoelectric conversion device 1010. FIG. 8B is a schematic sectional view of a photoelectric conversion device 1011. FIG. 8A illustrates a structure where, in the photoelectric conversion device 1004 in FIG. 5A, components including the microlens layer 232 are provided with the components being shifted in an X-axis direction with respect to the positions of the photoelectric conversion elements. In FIG. 8A, components similar to those in FIG. 6A are designated with the same signs, and the components of which the positions are shifted are designated with the same signs with primes. The components of which the positions are shifted are a microlens layer 232', a color filter layer 231', a second isolation portion 302', a fourth isolation portion 4', and a semiconductor region 300'. For example, if a first isolation portion 301 and those shifted components are projected onto a first plane P1, it is understood that the center positions of the shifted components, such as the second isolation portion 302, are different from those in FIG. 6A.

The relation of the amounts of shifting these components from their original positions are the microlens layer 232'≥ the color filter layer 231'≥ the second isolation portion 302'≥ the fourth isolation portion 4'≥ the semiconductor region 300'. These amounts of shifting can be changed according to the angle of incident light based on the positions of the photoelectric conversion elements when the photoelectric conversion device 1010 is used. When the amounts of shifting are examined or measured, based on, for example, the positions of a pixel at the center of a region where photoelectric conversion elements of the photoelectric conversion device 1010 are arranged and pixels in the periphery of the pixel at the center, the amounts of shifting the positions of elements on the first plane P1 side and elements on the second plane P2 side are examined or measured. The positions of the pixel at the center and the pixels in the periphery refer to the positions of pixels in a region where photoelectric conversion elements of the photoelectric conversion device 1010 are arranged, the positions of pixels in a region including effective pixels, or the positions of pixels centered around the optical axis position of an optical system for collecting light on the photoelectric conversion device 1010.

The amount of shifting a fourth isolation portion 4' provided between a first photoelectric conversion element PD1 and a fourth photoelectric conversion element PD4 in the X-axis direction is greater than the amount of shifting a fourth isolation portion 4' provided between a second photoelectric conversion element PD2 and a third photoelectric conversion element PD3 in the X-axis direction. Such a configuration enables a focus detection signal having higher accuracy. Further, according to the color of the color filter layer 231', a pixel in which a fourth isolation portion 4' is provided and a pixel in which a fourth isolation portion 4' is not provided may be combined together.

Next, FIG. 8B illustrates a structure where, in the photoelectric conversion device 1009 in FIG. 7B, components including the microlens layer 232 are provided with the components being shifted in an X-axis direction relative to the positions of the photoelectric conversion elements. In FIG. 8B, components similar to those in FIG. 7B are designated with the same signs, and the components of which the positions are shifted are designated with the same signs with primes. The components of which the positions are shifted are a microlens layer 232', a color filter layer 231', a second isolation portion 302', a semiconductor region 504', and a semiconductor region 300'. The relation of the amounts of shifting these components from their original positions are the microlens layer 232'≥ the color filter layer 231'≥ the second isolation portion 302'≥ the semiconductor region 504'≥ the semiconductor region 300'. The details are similar to those illustrated in FIG. 8A.

In FIG. 8B, the amount of shifting a semiconductor region 504' provided between a first photoelectric conversion element PD1 and a fourth photoelectric conversion element PD4 in the X-axis direction is equal to the amount of shifting a semiconductor region 504' provided between a second photoelectric conversion element PD2 and a third photoelectric conversion element PD3 in the X-axis direction. However, as in the fourth isolation portions 4' in FIG. 8A, the amounts of shifting the semiconductor regions 504' may be different from each other, or there may be a pixel in which a semiconductor region 504' is not provided.

(Example of Manufacturing Method)

With reference to FIGS. 9A to 9H, an example of a method for manufacturing a photoelectric conversion device will be described below. FIGS. 9A to 9H are schematic sectional views of structures in steps of the method for manufacturing a photoelectric conversion device. FIGS. 9A to 9H illustrate a method for manufacturing the photoelectric conversion device 1002 illustrated in FIG. 4A. For ease of description, a member before and after being subjected to a process is occasionally designated with the same sign.

Figure 9A:
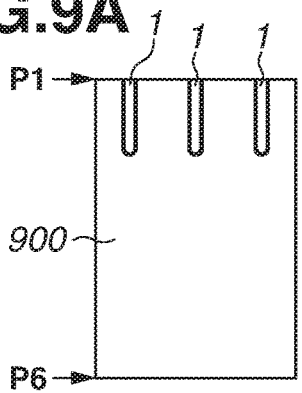
FIGS. 9A to 9H are schematic sectional views illustrating an example of a method for manufacturing a photoelectric conversion device.

In FIG. 9A, a first isolation portion 1 is formed in a substrate 900. The substrate 900 includes a first plane P1 and a sixth plane P6 and includes, for example, silicon. A method for forming the first isolation portion 1 is as follows. First, a part of the substrate 900 is removed from the first plane P1 side with anisotropic dry etching, thereby forming a groove. For example, the groove has a depth of 800 nm and a minimum width of 150 nm. The groove of the first isolation portion 1 has a depth of 750 nm or more. Further, if the thickness of the resulting semiconductor layer 100 is about 3 μm, the groove of the first isolation portion 1 can be formed up to 2400 nm, depending on the thickness of the resulting semiconductor layer 100. The groove can be formed such that the minimum width is 150 nm or less.

A BSG film is then formed in the groove through an atomic layer deposition (ALD) method. Then, a polysilicon film is formed through a low pressure chemical vapor deposition (LPCVD) method. Subsequently, boron is thermally diffused to the substrate 900 by heat treatment, thereby forming a pinning layer. The pinning layer may be formed by boron being implanted into the substrate 900 through ion implantation before forming the films in the groove. The formation of the BSG film is optional. The BSG film formed through the ALD method may not be observed through a transient electromagnetic method (TEM) method. After the groove is filled with the BSG film and the polysilicon film, the BSG film and the polysilicon film formed on the substrate 900 are removed through, for example, a chemical mechanical planarization (CMP) method, thus planarizing the substrate 900. In this process, there is a possibility that global depressions and protrusions in the substrate are present on the first plane P1 due to the planarization process. Although the groove includes the BSG film and the polysilicon film in the above description, the groove may include silicon oxide or silicon nitride. At this time, polysilicon is in an electrically floating state, and the pinning layer is connected to any potential, e.g., a ground potential in this case.

Figure 9B:
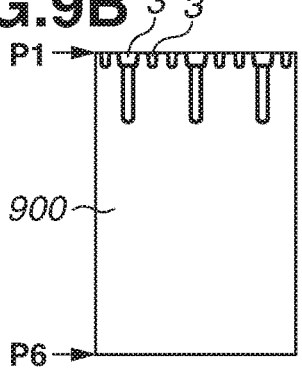

Next, in FIG. 9B, a third isolation portion 3 is formed in the substrate 900. The third isolation portion 3 has a shallow trench isolation (STI) structure. The substrate 900 and the first isolation portion 1 are partially removed by etching in a general semiconductor process to form a groove. Subsequently, boron is implanted into the substrate 900 through ion implantation to form a pinning layer. A silicon oxide film is formed on the inner wall of the groove with heat treatment. A silicon oxide film is formed through a chemical vapor deposition (CVD) method. After the groove is filled with the silicon oxide films, the silicon oxide films formed on the substrate 900 are removed through the CMP method, thereby planarizing the substrate 900. The removal of the BSG film and the polysilicon film and the removal of the silicon oxide films may be simultaneously performed. Here, the third isolation portion 3 has a depth of 300 nm and a width of 200 nm. Although the groove includes silicon oxide in the above description, the groove may include silicon nitride.

Figure 9C:
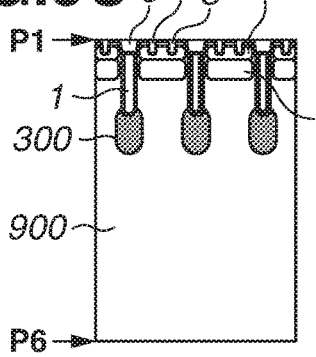
Figure 9D:
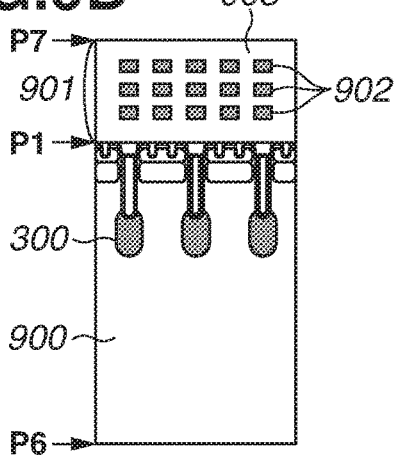

Referring now to FIG. 9C, phosphorus or boron is implanted into the substrate 900 through ion implantation to form semiconductor regions 222, 223, and 300. Before, after, or while the semiconductor regions 222, 223, and 300 are formed, a gate electrode including, for example, polysilicon is formed. Subsequently, a multi-layer wiring structure 901 is formed on the first plane P1 side of the substrate 900 (FIG. 9D). The multi-layer wiring structure 901 includes a plurality of insulating layers including, for example, silicon oxide or silicon nitride, a plurality of wiring layers including a conductor, such as aluminum or copper, and a plug including a conductor, such as tungsten or polysilicon.

Figure 9E:
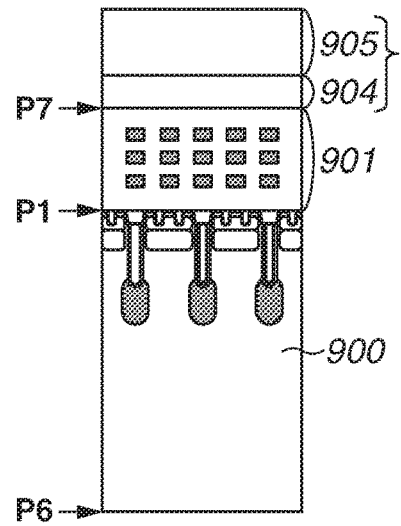

Subsequently, a supporting substrate 906 is provided on a seventh plane P7 side (FIG. 9E). The supporting substrate 906 includes, for example, a portion 904 including silicon oxide and a portion 905 including silicon. A method for bonding the substrate 900 and the multi-layer wiring structure 901 to the supporting substrate 906 may be adhesive bonding, or another known method can be appropriately used. In view of the influence on the wiring structure, however, it is desirable to perform the bonding with a process at 400° C. or less.

Figure 9F:
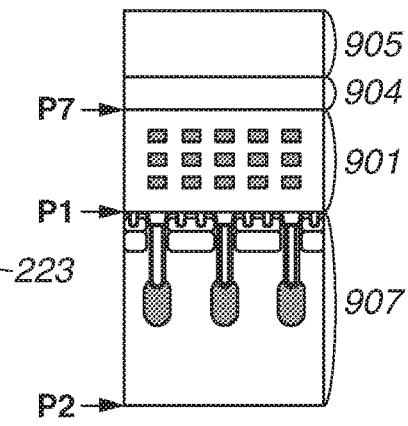

The substrate 900 is thinned from the sixth plane P6 side using the supporting substrate 906 as a support, thereby obtaining a structure illustrated in FIG. 9F. In FIG. 9F, a second plane P2 appears on a substrate 907. The thinning is performed by any method, such as the CMP method, dry etching, or wet etching. The thickness of the thinned substrate 907 can be up to 1 to 10 μm. In view of the light reception sensitivity of a photoelectric conversion element and the mechanical strength of the substrate 907, it is desirable that the thickness of the substrate 907 should be about 2 to 5 μm. Particularly, in a case where a photoelectric conversion device for visible light includes fine pixels, it is desirable that the thickness of the substrate 907 should be about 2.4 µm. This thickness enables 50% of incident light of 700 nm to be photoelectrically converted.

Figure 9G:
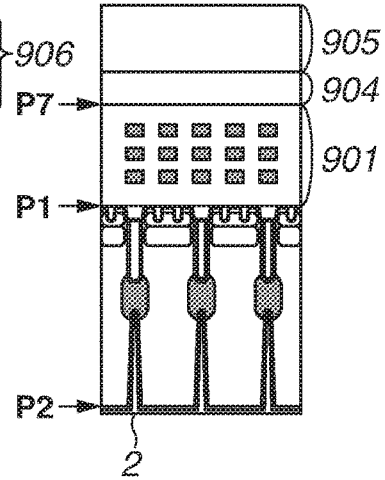
Figure 9H:
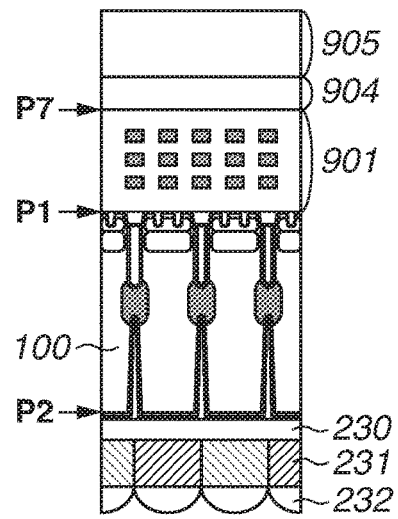

As illustrated in FIG. 9G, a second isolation portion 2 is formed in the substrate 900 from the second plane P2 side. A method for forming the second isolation portion 2 is as follows. First, a part of the substrate 900 is removed from the second plane P2 side through, for example, anisotropic dry etching, thereby forming a groove. The groove has a depth of 1200 nm and a minimum width of 150 nm, for example. The groove of the second isolation portion 2 also has a depth of 750 nm or more. Further, if the thickness of the resulting semiconductor layer 100 is about 3 µm, the groove of the second isolation portion 2 can be formed up to 2400 nm, depending on the thickness of the resulting semiconductor layer 100. The groove can be formed such that the minimum width is 150 nm or less.

An aluminum oxide film is then formed in the groove through the ALD method. A hafnium oxide film is then formed. These films can function as fixed charge layers. These fixed charge layers enable, for example, suppression of a dark current which generates on the surface of the groove. The fixed charge layers are also formed on the second plane P2 of the substrate 900. Although the groove includes aluminum oxide and hafnium oxide in the above description, any material such as tantalum oxide, titanium oxide, hafnium oxynitride, or aluminum oxynitride can be selected. Additionally, examples of the material include lanthanum oxide, praseodymium oxide, zirconium oxide, cerium oxide, and neodymium oxide. Further, materials such as TaO, AlO, HfO, SiO, SiCNO, and HfAlO can be appropriately combined together.

Subsequently, on the second plane P2 side, a fourth film 230 including a protection layer including an inorganic insulator, such as silicon oxide or silicon nitride, and a planarizing layer including an organic material is formed, and a color filter layer 231 is formed. A microlens layer 232 is then formed. With such steps, a semiconductor apparatus is manufactured.

In forming the grooves of the first isolation portion 1 and the second isolation portion 2, the Bosch process in which a protection film forming step and an etching step are repeated every several seconds. In processing the groove of the second isolation portion 2 through dry etching, a terminal may be detected using the first isolation portion 1. Alternatively, etching may be performed with the etching time being specified based on the film thickness of the substrate 900.

In a case where grooves having different depths as illustrated in FIG. 5A are formed as the grooves of the first isolation portion 1 and the second isolation portion 2, the grooves can be simultaneously formed using the same etching mask (not illustrated). Etching the substrate 900 under an etching condition using the microloading effect enables a formation of a deep groove below a wide opening of the mask pattern of an etching mask and a formation of a shallow groove below a narrow opening of the mask pattern. The microloading effect is the phenomenon that the smaller the opening width, the lower the etching speed. By setting the mask pattern of an etching mask, it is possible to form grooves having different depths in a simple step. It is also possible to etch the substrate 900 under an etching condition using the inverse microloading effect. In such a case, it is possible to form a deep groove below a narrow opening of the mask pattern of an etching mask and form a shallow groove below a wide opening of the mask pattern. As a matter of course, it is also possible to form a deep groove and a shallow groove in different steps.

(Shapes of Isolation Portions)

With reference to FIGS. 10A to 10F, the shapes of isolation portions are described. The structures of the isolation portions described in FIGS. 10A to 10F are applied to any of the isolation portions described in the exemplary embodiments.

Figure 10A:
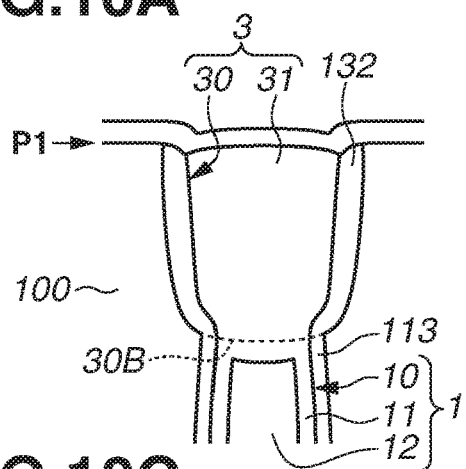
FIGS. 10A to 10F are schematic sectional views each illustrating isolation portions.

FIG. 10A is a schematic sectional view illustrating, for example, the first isolation portion 1 and the third isolation portion 3 in FIG. 3A. The first isolation portion 1 includes a groove 10, a portion 11 including BSG, and a portion 12 including polysilicon. A semiconductor region 113 is provided around the first isolation portion 1. In the third isolation portion 3, a portion 31 including silicon oxide is provided in a groove 30, and a semiconductor region 132 is provided around the groove 30. Here, after the first isolation portion 1 is formed, the third isolation portion 3 is formed. It seems as if the portion 31 of the third isolation portion 3 and the portion 11 of the first isolation portion 1 are integrated. The portion 12 is located away from a line 30B toward a second plane P2. This is because the portion 12 is removed before the semiconductor layer 100 when the groove 30 is formed. Here, a first plane P1 includes, on its surface, a depression at the boundary between the groove 30 and the portion 31.

Figure 10B:
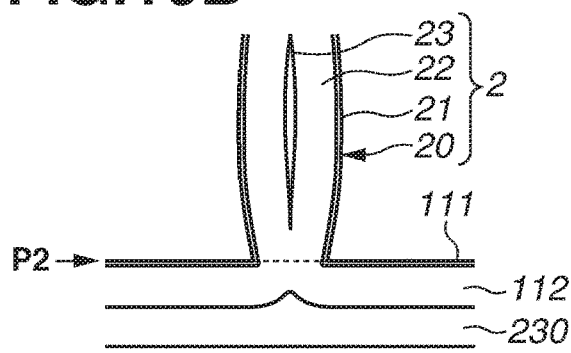

FIG. 10B is a schematic sectional view illustrating, for example, the second isolation portion 2 in FIG. 1. The second isolation portion 2 includes a groove 20, a portion 21 including aluminum oxide, and a portion 22 including hafnium oxide. The portions 21 and 22 extend from the groove 20 onto a second plane P2, thereby forming a second layer 111 and a third layer 112, respectively. A fourth film 230 includes, for example, a silicon oxide film. A gap 23 may be provided in the portion 22.

Figure 10C:
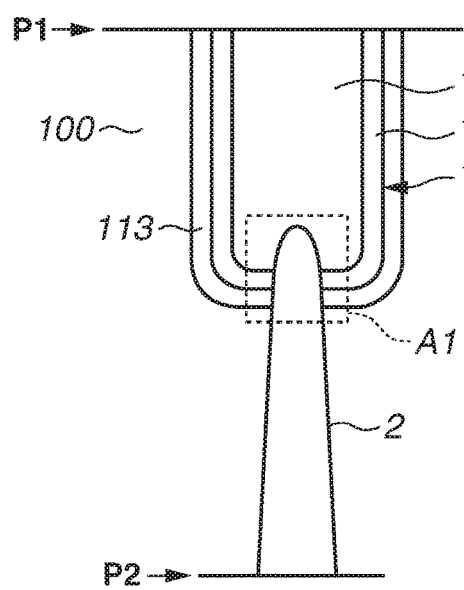
Figure 10D:
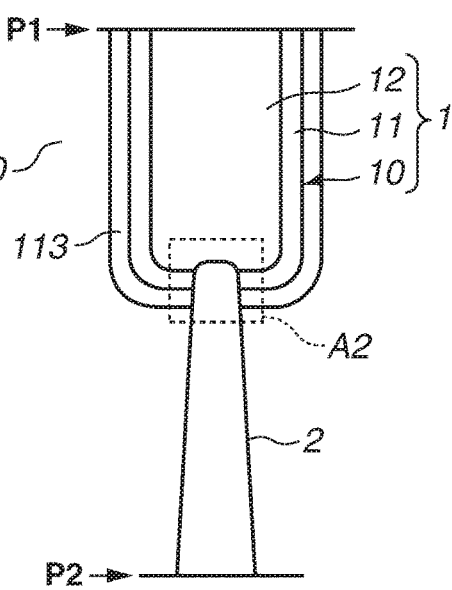

FIGS. 10C and 10D are schematic sectional views each illustrating, for example, a portion where the first isolation portion 1 and the second isolation portion 2 in FIG. 1 are in contact with each other. To facilitate understanding, FIGS. 10C and 10D also illustrate a first plane P1 and a second plane P2. In FIG. 10C, a portion 12 includes polysilicon. In FIG. 10D, a portion 12 includes silicon nitride. As illustrated in a region A1 in FIG. 10C, the second isolation portion 2 bites into the first isolation portion 1, and an end portion of the second isolation portion 2 extends to the portion 12. It is understood that the extremity of the end portion of the second isolation portion 2 is round. This is because if an etching condition for silicon of the semiconductor layer 100 is used to form the groove of the second isolation portion 2, the etching rate of silicon and the etching rate of polysilicon are close to each other, and thus, the portion 12 in FIG. 10C is scraped off. By contrast, in a region A2 in FIG. 10D, the extremity of the second isolation portion 2 is located at the boundary between the portions 11 and 12 and has a flat shape. This is because silicon nitride of the portion 12 in FIG. 10D is little etched under an etching condition for silicon.

Figure 10E:
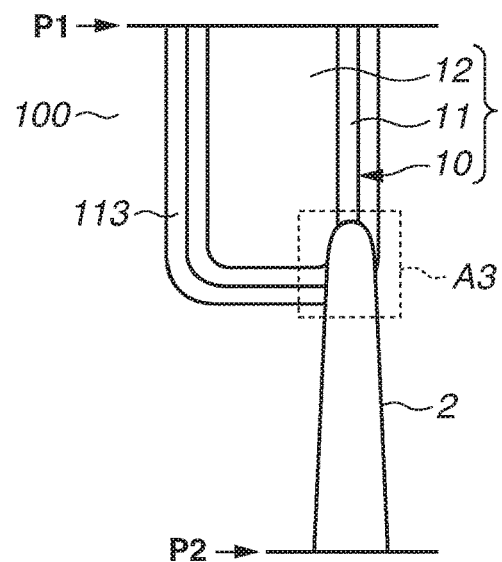
Figure 10F:
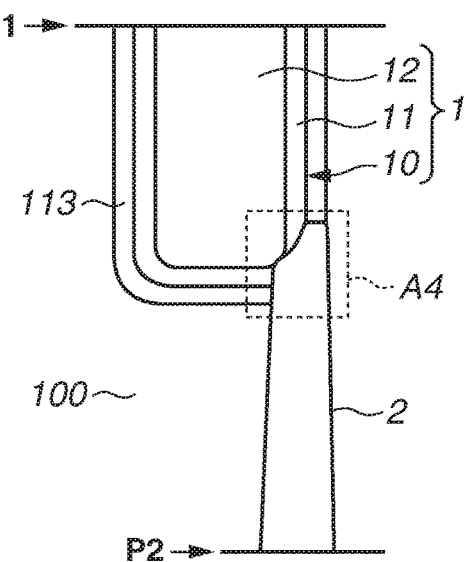

FIGS. 10E and 10F are schematic sectional views each illustrating, for example, a portion where the first isolation portion 1 and the second isolation portion 2 in FIG. 1 are in contact with each other. FIG. 10E corresponds to FIG. 10C, and FIG. 10F corresponds to FIG. 10D. FIGS. 10E and 10F each illustrate a case where the first isolation portion 1 and the second isolation portion 2 are in contact with each other in an offset manner. Also in these cases, in a region A3, the extremity of the second isolation portion 2 is pointed, and in a region A4, the extremity of the second isolation portion 2 is flat near the portion 12 and pointed near the boundary of the groove 10.

Figure 11:
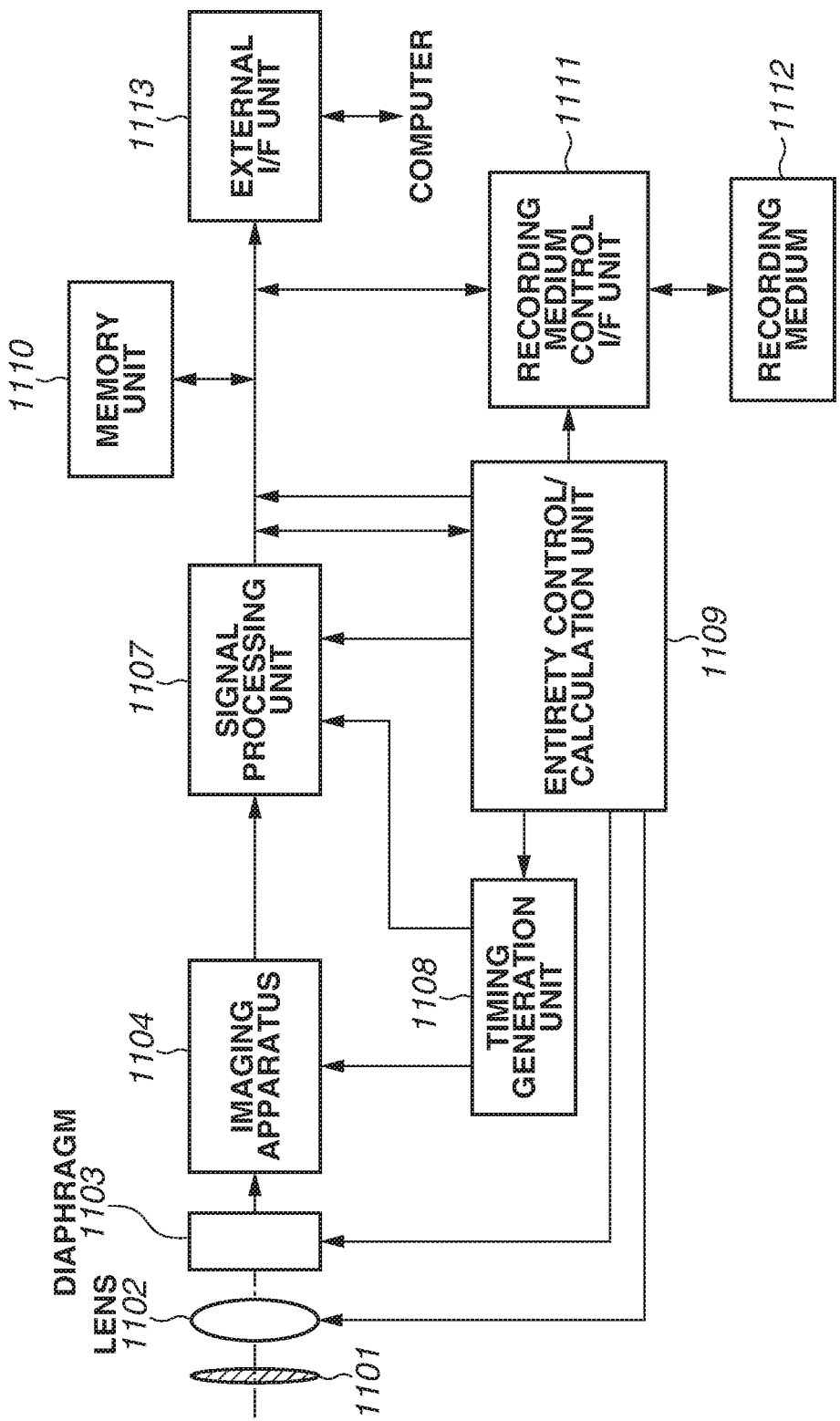
FIG. 11 is a schematic diagram illustrating an imaging system.

A seventh exemplary embodiment, an exemplary embodiment of an imaging system, will be described below. Examples of the imaging system include a digital still camera, a digital camcorder, a camera head, a copying machine, a fax, a mobile phone, a smartphone, an in-vehicle camera, and an observation satellite. FIG. 11 illustrates a block diagram of a digital still camera as an example of the imaging system.

In FIG. 11, a barrier 1101 protects a lens 1102. The lens 1102 forms an optical image of an object on an imaging apparatus 1104. A diaphragm 1103 changes the amount of light transmitted through the lens 1102. The imaging apparatus 1104 includes the photoelectric conversion device described in any of the above exemplary embodiments.

A signal processing unit 1107 performs a correction process and a data compression process on a pixel signal output from the imaging apparatus 1104 and acquires an image signal. FIG. 11, a timing generation unit 1108 outputs various timing signals to the imaging apparatus 1104 and the signal processing unit 1107. An entirety control unit 1109 controls the entirety of the digital still camera. A frame memory unit 1110 temporarily stores image data. An interface unit 1111 records or reads data in or from a recording medium. An attachable and detachable recording medium 1112, such as a semiconductor memory, is used to record or read imaging data therein or therefrom. An interface unit 1113 communicates with, for example, an external computer.

The imaging system needs to include at least the imaging apparatus 1104 and the signal processing unit 1107 for processing a pixel signal output from the imaging apparatus 1104. In such a case, the other components are disposed outside the system.

As described above, in the exemplary embodiment of the imaging system, an imaging apparatus according to the second exemplary embodiment is used as the imaging apparatus 1104. Such a configuration enables a digitalized imaging signal to be accurately output outside the imaging system.

Figure 12A:
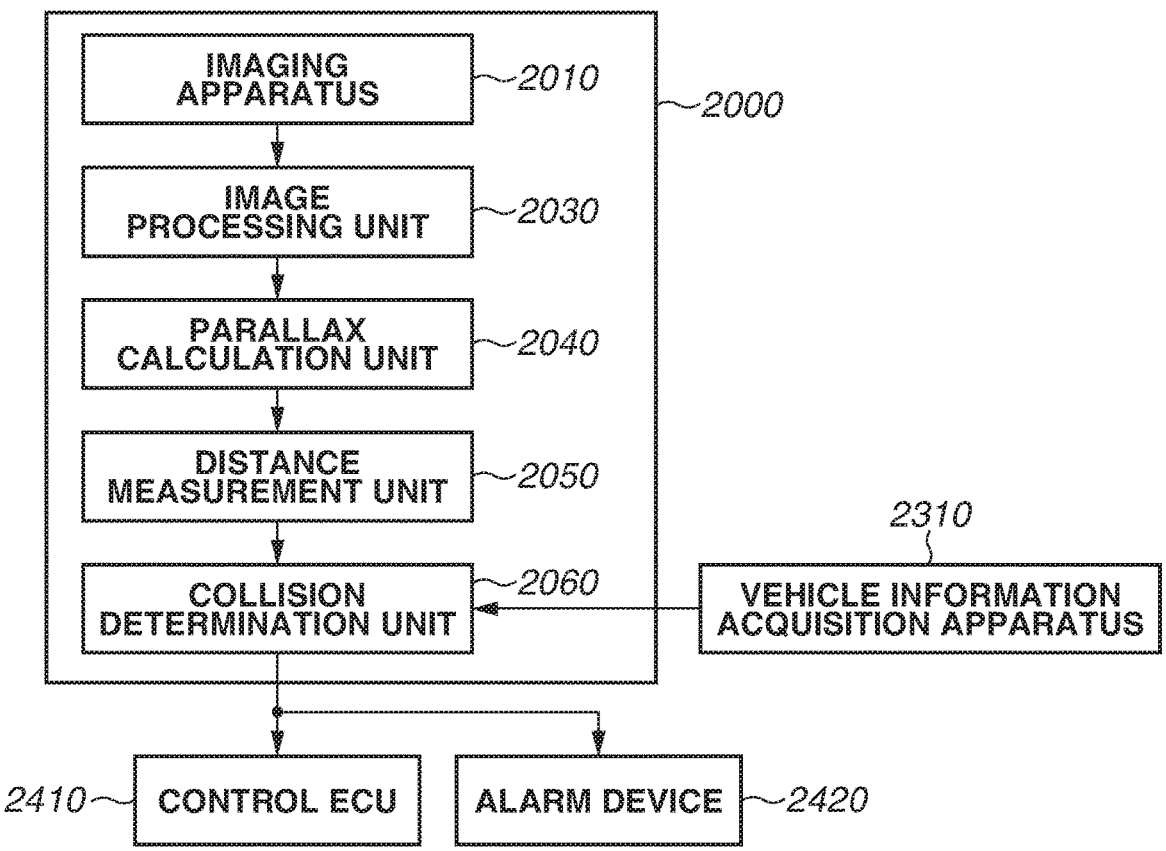
FIGS. 12A and 12B are schematic diagrams each illustrating a moving body.

An eighth exemplary embodiment will be described below. FIG. 12A illustrates an example of an imaging system regarding an in-vehicle camera. An imaging system 2000 includes an imaging apparatus 2010. The imaging apparatus 2010 includes the photoelectric conversion device described in any of the above exemplary embodiments. The imaging system 2000 includes an image processing unit 2030 that performs image processing on a plurality of pieces of image data acquired by the imaging apparatus 2010, and a parallax calculation unit 2040 that calculates a parallax (the phase difference between parallax images) from a plurality of pieces of image data acquired by the imaging system 2000. Further, the imaging system 2000 includes a distance measurement unit 2050 that calculates the distance from a target object based on the calculated parallax, and a collision determination unit 2060 that, based on the calculated distance, determines whether there is a possibility of collision. The parallax calculation unit 2040 and the distance measurement unit 2050 are examples of a distance information acquisition unit for acquiring distance information about the distance from a target object. That is, the distance information includes the parallax, the amount of defocus, and the distance from the target object. Using any of these pieces of distance information, the collision determination unit 2060 may determine the possibility of collision. The distance information acquisition unit may be implemented by hardware designed exclusively for the distance information acquisition unit, or may be implemented by a software module. Alternatively, the distance information acquisition unit may be implemented by a field-programmable gate array (FPGA) or an application-specific integrated circuit (ASIC). Yet alternatively, the distance information acquisition unit may be implemented by the combination of these.

The imaging system 2000 is connected to a vehicle information acquisition apparatus 2310 and can acquire vehicle information, such as the speed of the vehicle, the yaw rate, and the steering angle. Furthermore, the imaging system 2000 is connected to a control electronic control unit (ECU) 2410 that produces a control signal for generating a braking force in the vehicle based on the determination result of the collision determination unit 2060. Further, the imaging system 2000 is also connected to an alarm device 2420 that gives an alarm to a driver based on the determination result of the collision determination unit 2060. For example, as the determination result of the collision determination unit 2060, if there is a high possibility of collision, the control ECU 2410 performs a vehicle control, such as applying a brake, returning the gas pedal, or suppressing the engine output in order to avoid collision and reduce damage. The alarm device 2420 warns a user by setting off an alarm such as a sound, displaying alarm information on a screen of an automotive navigation system, or providing a vibration to a seat belt or the steering.

Figure 12B:
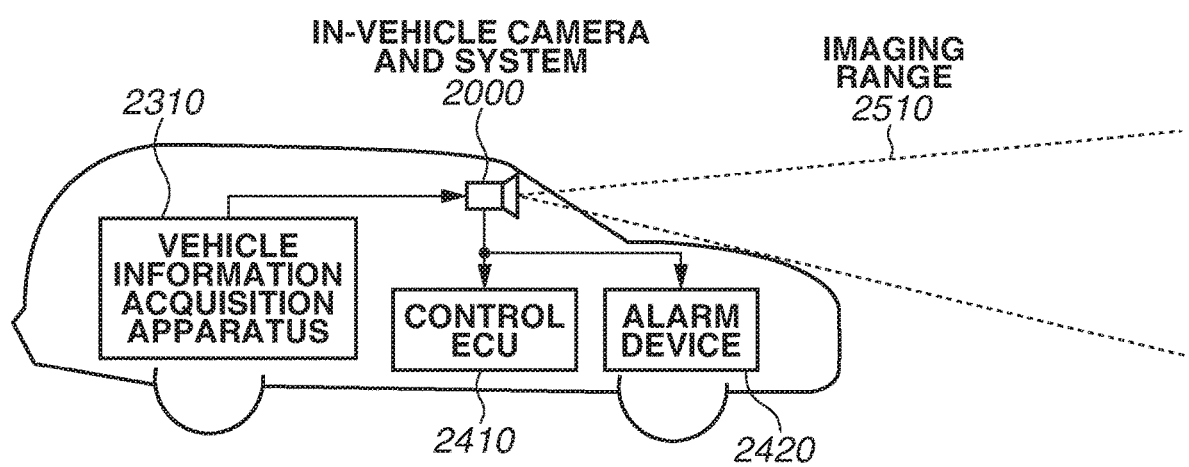

In the present exemplary embodiment, the imaging system 2000 captures the periphery, such as the front direction or the rear direction, of the vehicle. FIG. 12B illustrates an example of the imaging system 2000 in a case where the imaging system 2000 captures the front direction of the vehicle. In the above description, an example has been described where a vehicle control is performed to avoid colliding with another vehicle. Alternatively, the present exemplary embodiment is also applicable to control for automatically driving a vehicle through following of another vehicle, or control for automatically driving a vehicle so as to stay in a lane. Further, the imaging system can be applied not only to a vehicle, such as an automobile, but also to a moving body (a moving apparatus), such as a vessel, an aircraft, or an industrial robot. Additionally, the imaging system can be applied not only to a moving body but also to a device widely using object recognition, such as an intelligent transportation system (ITS).

The photoelectric conversion device according to each of the exemplary embodiments is not limited to the CMOS-type image sensor described in the exemplary embodiments, and can be applied to a semiconductor apparatus in which at least two light-receiving elements (photoelectric conversion elements) are provided. Moreover, regarding the semiconductor regions according to each of the exemplary embodiments, the first conductivity type is a P-type, and the second conductivity type is an N-type. Alternatively, the first conductivity type can also be an N-type, and the second conductivity type can also be a P-type.

According to the disclosure, it is possible to provide a photoelectric conversion device having a fine isolation structure.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-022397, filed Feb. 9, 2018, which is hereby incorporated by reference herein in its entirety.

What is claimed is:

1. A photoelectric conversion device comprising:
a semiconductor layer including a first plane and a second plane placed opposite to the first plane and including first, second, and third photoelectric conversion elements, wherein the second photoelectric conversion element is positioned between the first and third photoelectric conversion elements;
a first isolation portion that is disposed in the semiconductor layer, includes an insulator, and extends from the first plane to a position corresponding to at least a quarter of a length from the first plane to the second plane; and
a second isolation portion that is disposed in the semiconductor layer, includes an insulator, and extends from the second plane to a position corresponding to at least a quarter of the length from the first plane to the second plane,
wherein the first and second isolation portions are disposed between the first and second photoelectric conversion elements, and
wherein a single microlens is disposed corresponding to the second and third photoelectric conversion elements.

2. The photoelectric conversion device according to claim 1,
wherein the first isolation portion is provided by a part of the semiconductor layer being removed from the first plane, and
wherein the second isolation portion is provided by a part of the semiconductor layer being removed from the second plane.

3. The photoelectric conversion device according to claim 1, wherein a width of the second isolation portion on the second plane is narrower than a width of the first isolation portion on the first plane.

4. The photoelectric conversion device according to claim 1, wherein a length of the second isolation portion from the second plane is shorter than a length of the first isolation portion from the first plane.

5. The photoelectric conversion device according to claim 1, wherein the first and second isolation portions are in contact with each other.

6. The photoelectric conversion device according to claim 1, wherein between the first and second isolation portions, a first semiconductor region as a potential barrier against electric charges generated in the first and second photoelectric conversion elements is disposed.

7. The photoelectric conversion device according to claim 1, wherein the first isolation portion includes a third isolation portion including a shallow trench isolation (STI) structure on the first plane.

8. The photoelectric conversion device according to claim 1, wherein the first isolation portion includes at least polysilicon, and the second isolation portion includes at least hafnium oxide.

9. The photoelectric conversion device according to claim 1, wherein the first isolation portion includes at least silicon nitride, and the second isolation portion includes at least hafnium oxide.

10. The photoelectric conversion device according to claim 1, wherein the second isolation portion includes aluminum oxide.

11. The photoelectric conversion device according to claim 1, wherein in a planar view, a center position of the first isolation portion and a center position of the second isolation portion are different from each other.

12. The photoelectric conversion device according to claim 1, wherein between the second and third photoelectric conversion elements, a second semiconductor region as a potential barrier against electric charges generated in the second and third photoelectric conversion elements is provided.

13. The photoelectric conversion device according to claim 12, wherein the first isolation portion is provided so that the first isolation portion extends to a position closer to the second plane than the second semiconductor region.

14. The photoelectric conversion device according to claim 1, further comprising a fourth isolation portion that is disposed, in the semiconductor layer, between the second and third photoelectric conversion elements and extends at least from the second plane toward the first plane.

15. The photoelectric conversion device according to claim 14, wherein the second isolation portion is provided so that the second isolation portion extends to a position closer to the first plane than the fourth isolation portion.

16. The photoelectric conversion device according to claim 14, wherein a width of the fourth isolation portion on the second plane is narrower than a width of the second isolation portion on the second plane.

17. The photoelectric conversion device according to claim 1, wherein in a case where the length from the first plane to the second plane is equal to or less than 3 μm, a width of the first isolation portion on the first plane is equal to or less than 150 nm, and a width of the second isolation portion on the second plane is equal to or less than 150 nm or less.

18. An imaging system comprising:
the photoelectric conversion device according to claim 1; and
a signal processing unit configured to process a signal output from the photoelectric conversion device.

19. A moving body comprising:
the photoelectric conversion device according to claim 1;
a distance information acquisition unit configured to acquire, from a parallax image based on a signal from the photoelectric conversion device, distance information regarding a distance from a target object; and
a control unit configured to control the moving body based on the distance information.

* * * * *